United States Patent
Hatakoshi et al.

(10) Patent No.: US 6,835,963 B2
(45) Date of Patent: Dec. 28, 2004

(54) LIGHT-EMITTING ELEMENT AND METHOD OF FABRICATION THEREOF

(75) Inventors: Genichi Hatakoshi, Yokohama (JP); Hidetoshi Fujimoto, Kawasaki (JP); Mamoru Terauchi, Hiroshima (JP)

(73) Assignee: Kabushiki Kaisha Toshiba, Kawasaki (JP)

( * ) Notice: Subject to any disclaimer, the term of this patent is extended or adjusted under 35 U.S.C. 154(b) by 0 days.

(21) Appl. No.: 10/465,649

(22) Filed: Jun. 20, 2003

(65) Prior Publication Data

US 2003/0209722 A1 Nov. 13, 2003

Related U.S. Application Data

(63) Continuation of application No. 09/468,949, filed on Dec. 22, 1999, now Pat. No. 6,611,003.

(51) Int. Cl.[7] .............................................. H01L 33/00
(52) U.S. Cl. ......................................... 257/98; 372/44
(58) Field of Search ............................................ 257/98

(56) References Cited

U.S. PATENT DOCUMENTS

| | | |
|---|---|---|
| 4,017,881 A | 4/1977 | Ono et al. |
| 5,301,201 A | 4/1994 | Dutta et al. |
| 5,314,838 A | 5/1994 | Cho et al. |
| 5,349,210 A | 9/1994 | Ackley et al. |
| 5,606,572 A | 2/1997 | Swirhun et al. |
| 5,633,527 A | 5/1997 | Lear |
| 6,044,100 A | 3/2000 | Hobson et al. |
| 6,121,604 A | 9/2000 | Hiraga et al. |
| 6,233,267 B1 | 5/2001 | Nurmikko et al. |
| 6,528,780 B1 * | 3/2003 | Mitsuoka et al. ........... 250/216 |

FOREIGN PATENT DOCUMENTS

| | | |
|---|---|---|
| JP | 64-785 | 1/1989 |
| JP | 5-21888 | 1/1993 |
| JP | 5-100168 | 4/1993 |
| JP | 7-297476 | 11/1995 |
| JP | 10-143895 | 5/1998 |
| JP | 10-172166 | 6/1998 |

* cited by examiner

*Primary Examiner*—Douglas Wille
(74) *Attorney, Agent, or Firm*—Oblon, Spivak, McClelland, Maier & Neustadt, P.C.

(57) ABSTRACT

This invention provides a light-emitting element that comprises a light-emitting portion made of a nitride semiconductor; and a first wavefront converter for converting the radiated shape of light that is emitted from the light-emitting portion into a radiated shape that is smaller than the wavelength thereof, and emitting the same as output light. In this case, the first wavefront converter has a small aperture of a diameter that is smaller than the wavelength of light that is emitted from the light-emitting portion. If the output light is made to comprise an evanescent wave that is emitted to the exterior through this small aperture, it is possible to obtain an extremely small light spot. This invention also relates to a surface-emitting type of light-emitting element comprising a multi-layered structure comprising a light-emitting layer; and a pair of electrodes for supplying a current to the light-emitting layer; wherein output light is emitted from a light-emitting surface on top of the multi-layered structure; and the pair of electrodes are recessed from the light-emitting surface to the light-emitting layer side. This makes it possible to bring the light-emitting surface extremely close to an object to be illuminated. The small aperture can be opened up in a self-aligning manner by using the light from the light-emitting portion. As a result, it is possible to provide a light-emitting element and a method of fabrication thereof that create beam characteristics that are suitable for use with an optical disc or the like.

20 Claims, 13 Drawing Sheets

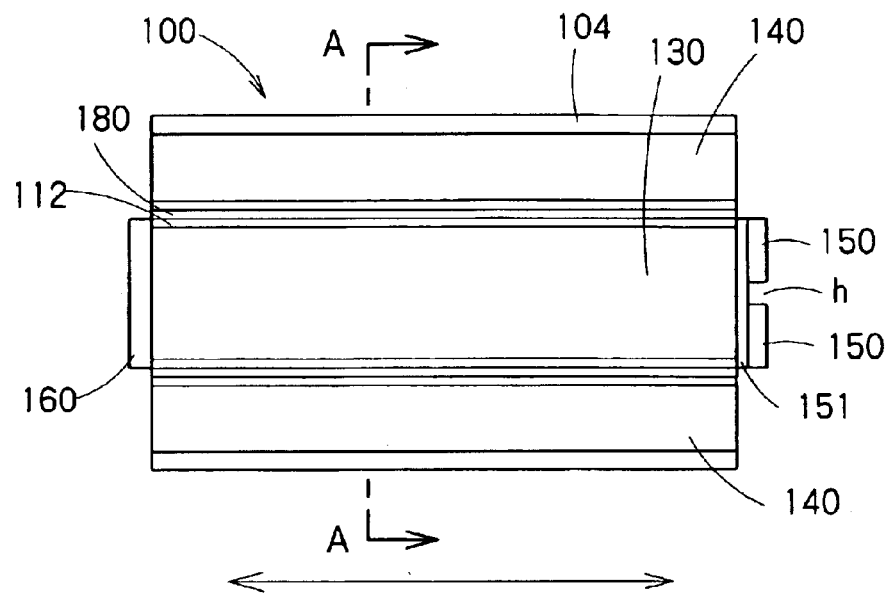
F I G. 1A
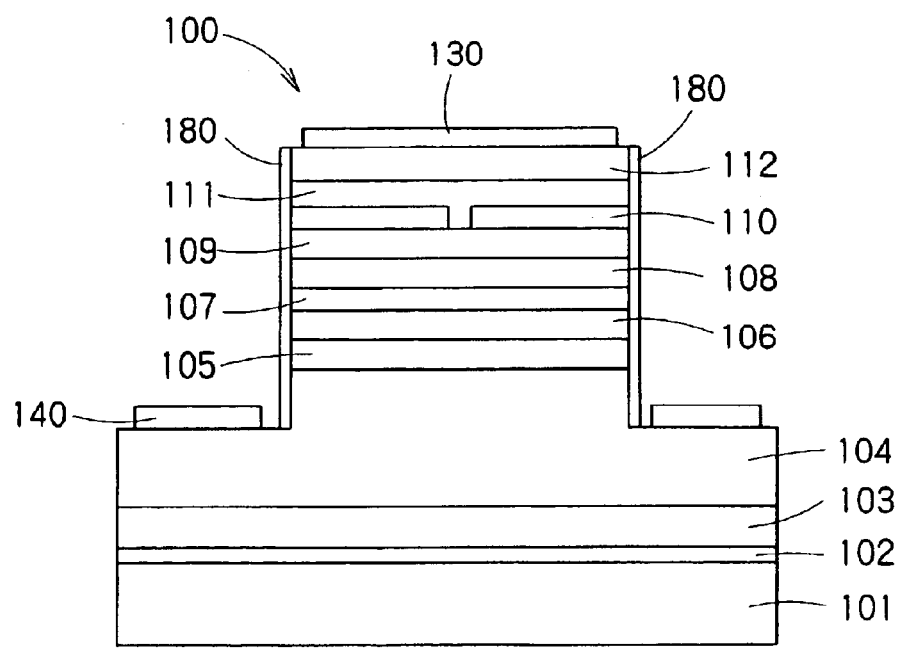
F I G. 1B

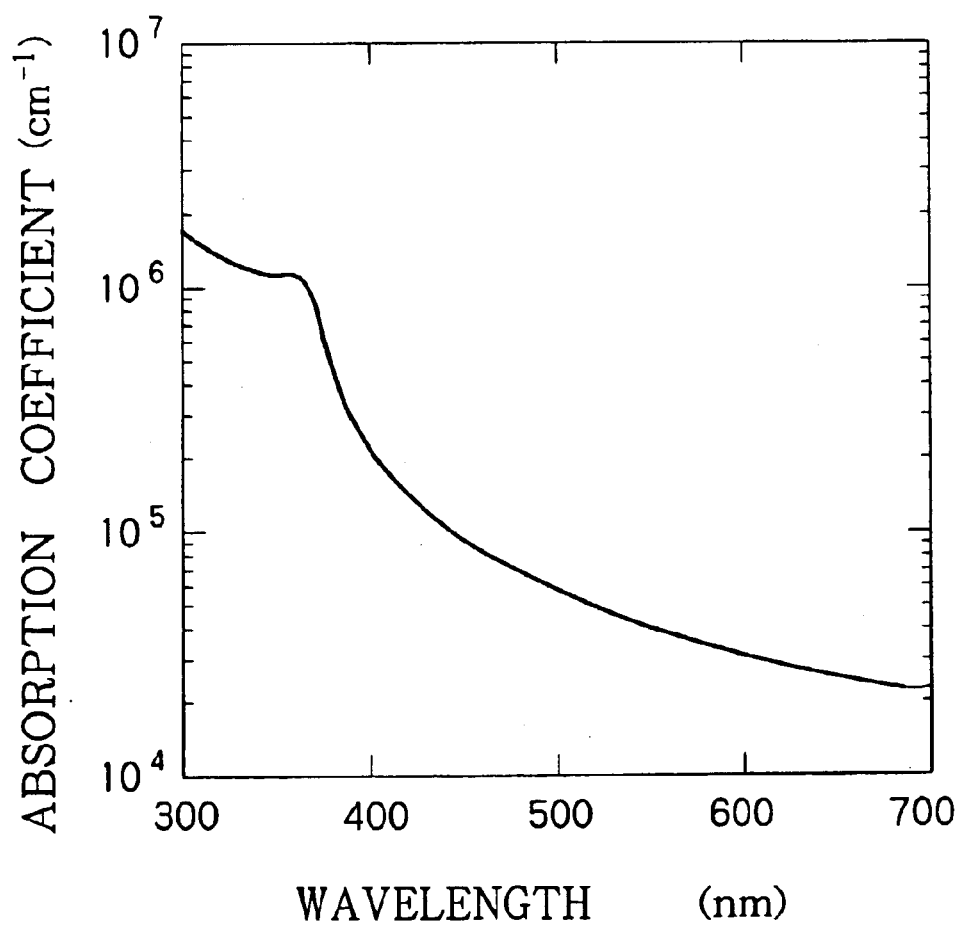
F I G. 2

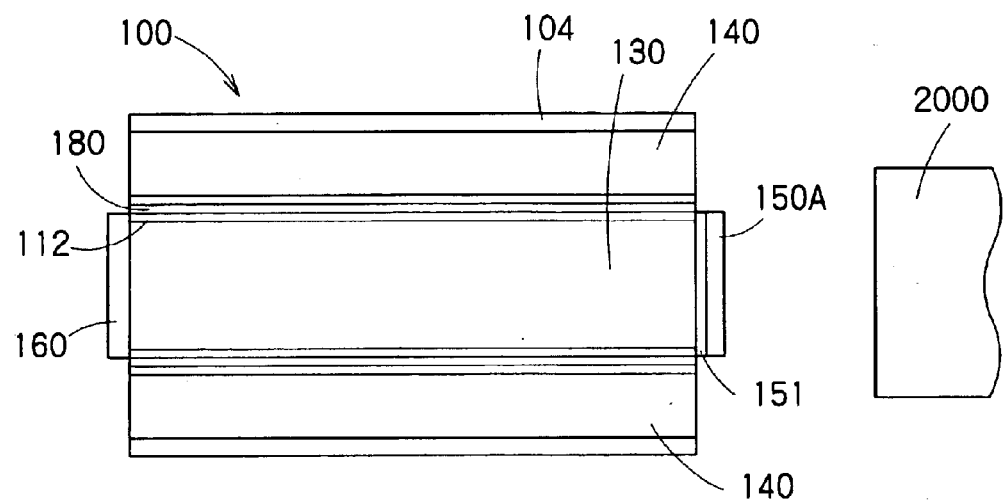
F I G. 3A
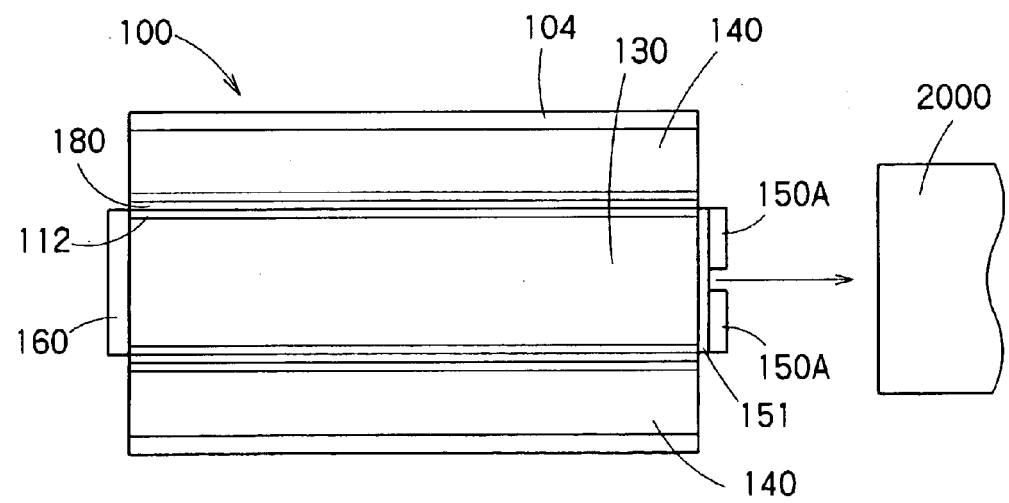
F I G. 3B

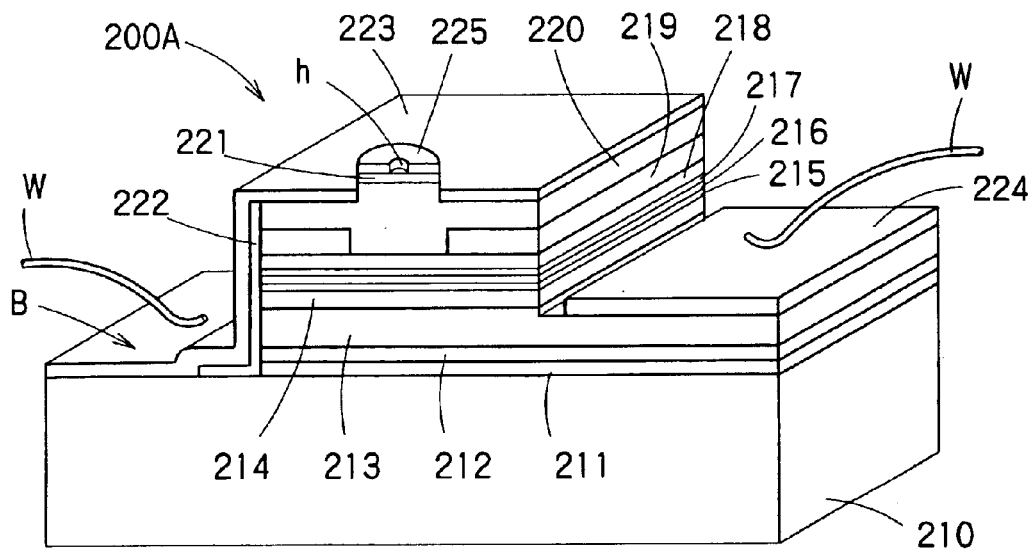
F I G. 4A
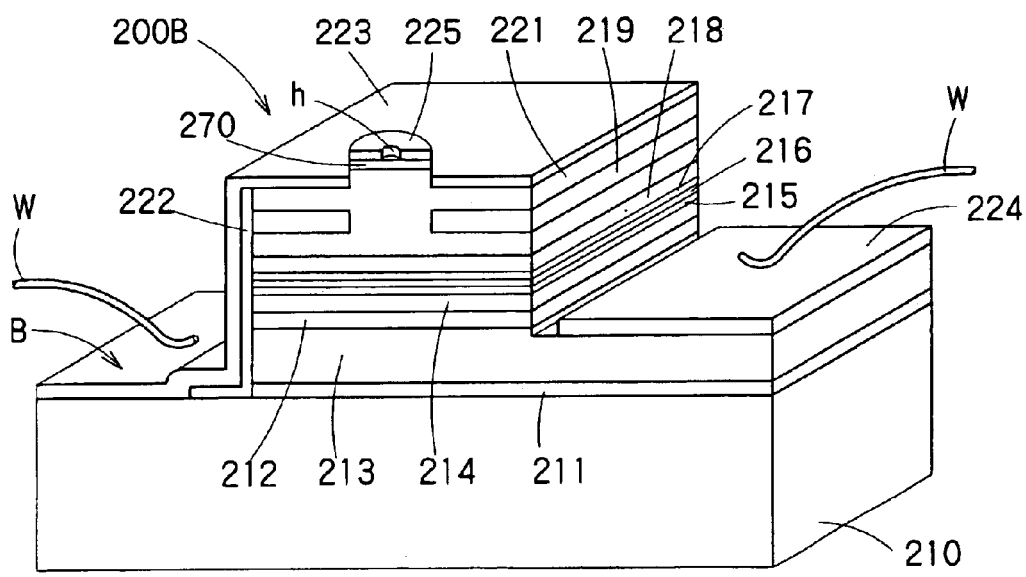
F I G. 4B

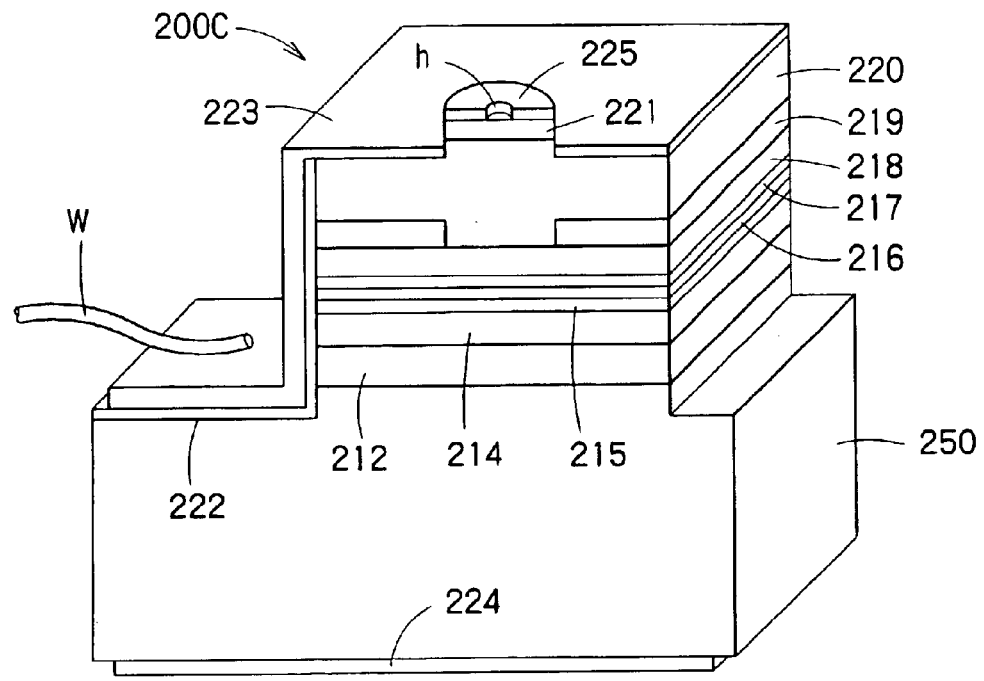
F I G. 5A
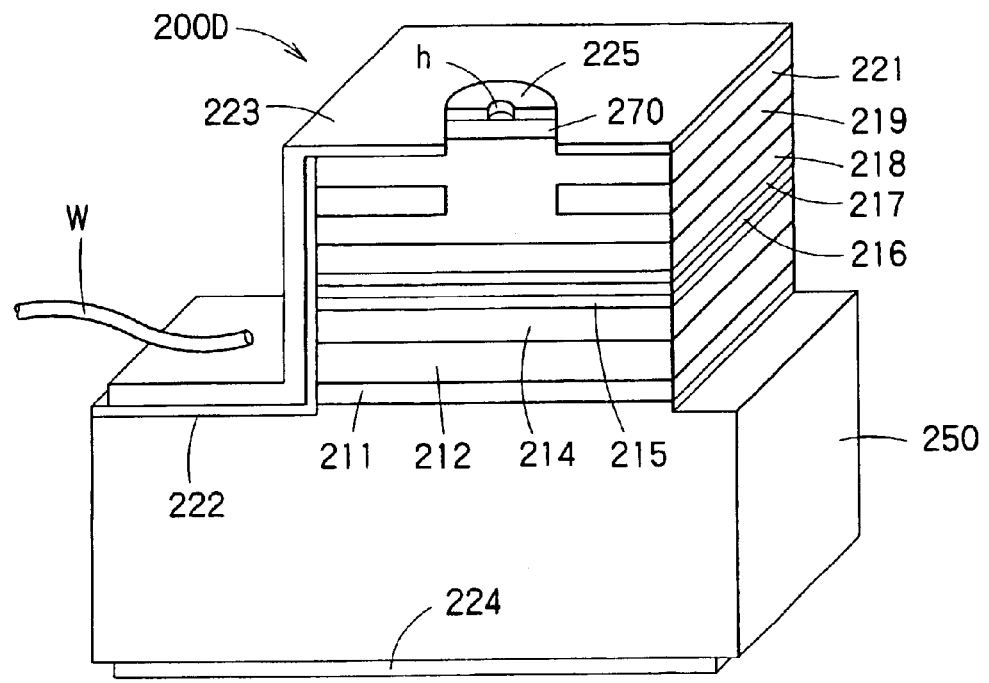
F I G. 5B

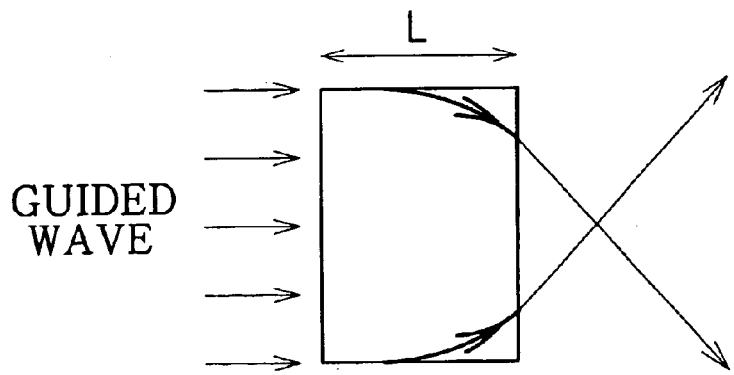
F I G. 11A
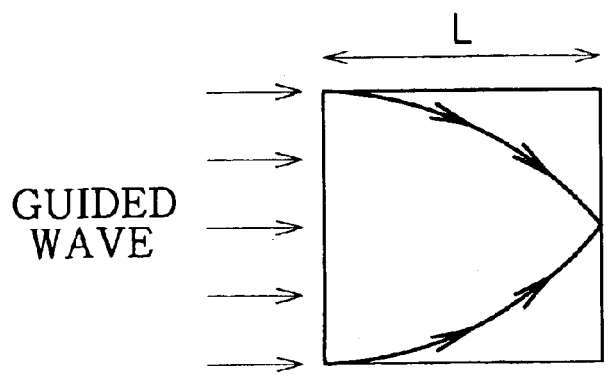
F I G. 11B
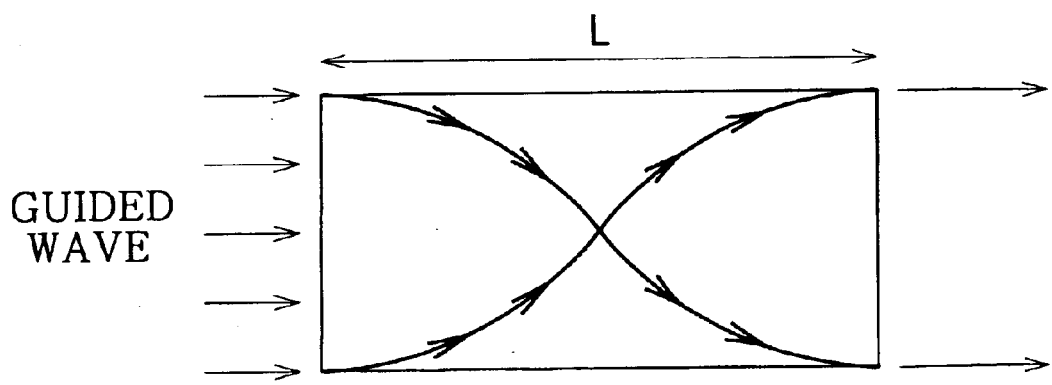
F I G. 11C

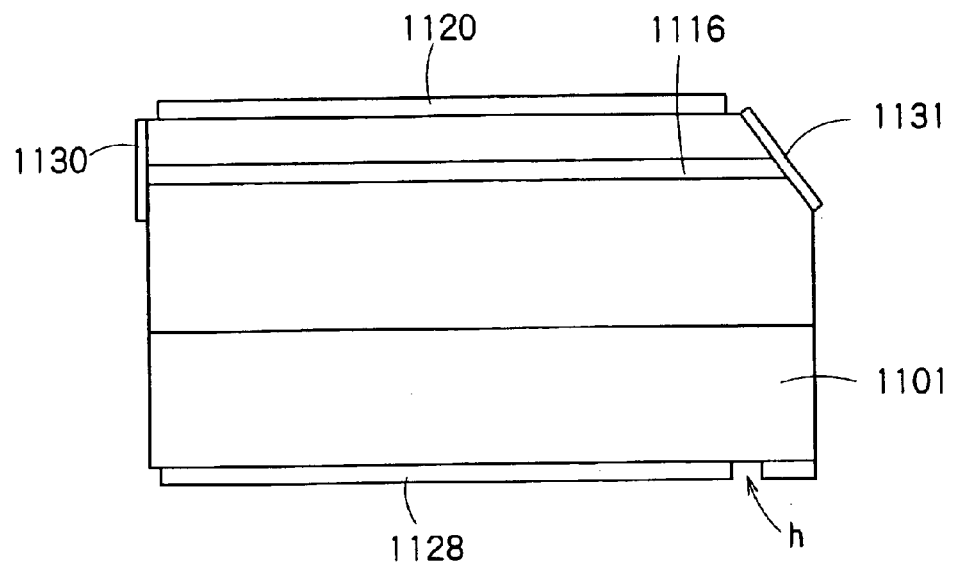
F I G. 13
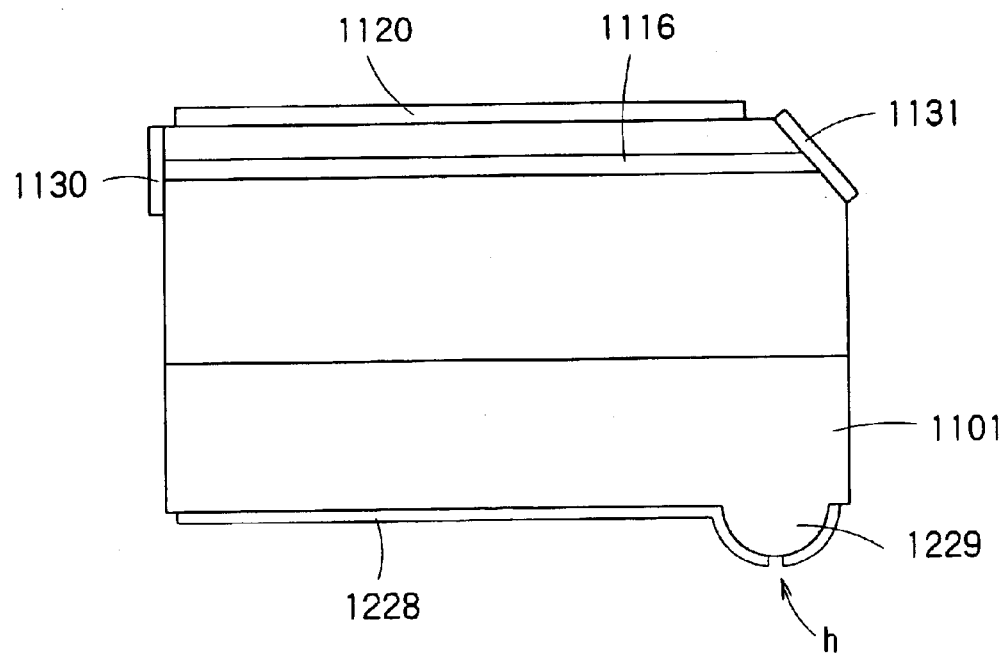
F I G. 14

LIGHT-EMITTING ELEMENT AND METHOD OF FABRICATION THEREOF

This application is a continuation application of, and claims priority to, prior application Ser. No. 09/468,949 filed Dec. 22, 1999 now U.S. Pat. No. 6,611,003.

BACKGROUND OF THE INVENTION

The present invention relates to a light-emitting element and a method of fabrication thereof using nitride semiconductors and, in particular, to a light-emitting element and a method of fabrication thereof that make it possible to extract light of an extremely small spot size.

It has recently become known to use nitride semiconductors such as GaN as materials for light-emitting diodes and semiconductor lasers in the wavelength region from blue to ultraviolet. These materials are attracting attention because they have direct-transition band structures and can achieve high light-emitting efficiencies. In particular, research and development is proceeding on semiconductor lasers using nitride semiconductors, which emit light of an extremely short wavelength on the order of 400 nm, so they can be expected to act as light sources for reading and writing data with respect to high-density optical discs having a capacity of at least 15 gigabytes per side.

Note that the term "nitride semiconductors" as used in this document comprises semiconductors of all compositions given by the chemical formula $In_xAl_yGa_zN$ (where $x \leq 1$, $y \leq 1$, $z \leq 1$, and $x+y+z=1$), where each of x, y, and z is varied throughout its respective range. For example, InGaN (where x=0.4, y=0, and z=0.6) is comprised within the term "nitride semiconductors." Furthermore, semiconductors wherein part of the indium, aluminum, or gallium, which are elements of the group III, is replaced with boron (B) or part of the nitrogen, which is an element of the group V, is replaced with arsenic (As) or phosphorous (P) are also comprised therein. In this case, semiconductors comprise any one of the three elements (In, Al, and Ga) listed above as group III elements and always comprise the nitrogen (N) as a group V element.

In such a semiconductor laser, the light emitted from the lasing region, in other words, the light-emitting portion thereof, expands rapidly with distance therefrom. When such a laser is used as a light source of an optical disc system, the light must be focused with a lens.

However, there are problems in that it is difficult to design the diameter and curvature of the lens because the lasing spot of a short-wavelength semiconductor laser is generally small and the lasing wavelength is so short at approximately 400 nm, and it is also extremely difficult to align the optical axes of the laser and the lens.

In addition, the diameter of the spot at the diffraction limit that can be focused by a lens is proportional to the wavelength, so that shortening the wavelength of the light source is an important technique in increasing the recording density. However, simply shortening the wavelength makes it impossible to focus the projected light to a tiny spot. In other words, it is necessary to develop some sort of lateral-mode control structure in order to obtain suitable beam characteristics. In general, crystalline growth and machining techniques have not yet been developed far enough for nitride semiconductors, however, and thus there is a problem in that it is difficult to implement a complicated lateral-mode control structure. In other words, there are still many problems to solve in the implementation of beam characteristics that can be used with an optical disc with a system that can achieve continuous room-temperature lasing using an InGaAlN laser.

If the wavelength of the light is short, moreover, precision control is required for the accuracy and adjustment of the optical system that is used. To reduce the wavelength and spot diameter in this case, aberration and other problems of the lens must also be controlled to small values. Thus problems increase as the wavelength shortens, making it difficult to implement and adjust such a high-precision optical system.

As discussed above, it is difficult to fabricate a lateral-mode control structure with a nitride semiconductor laser and it is difficult to implement beam characteristics that can be used for optical discs. When such a short-wavelength light-emitting element is used as a light source for an optical disc or the like, it is difficult to implement a high-precision optical system that is matched to the wavelength, and to adjust such an optical system with a high degree of precision.

SUMMARY OF THE INVENTION

The present invention was devised in the light of the above described problems and has as an objective thereof the provision of a light-emitting element that is provided with beam characteristics that make it suitable for use with an optical disc or the like.

The gist of this invention makes it possible to implement beam characteristics that are suitable for use in an optical disc system or the like, by the provision of a wavefront converter in a short-wavelength light-emitting element.

In other words, the light-emitting element of the present invention comprises a light-emitting portion made of a nitride semiconductor; and a first wavefront converter converting the radiating range of light that is emitted from the light-emitting portion into a radiating range that is smaller than the wavelength thereof, and outputting the same as output light.

In this case, if the first wavefront converter has a small aperture such as a pinhole that has a diameter that is smaller than the wavelength of the light that is emitted from the light-emitting portion, and the output light comprises an evanescent wave that is output to the exterior through this small aperture, it is possible to obtain an extremely small light spot.

The light-emitting element could be further provided with a transparent dielectric layer on the light-emitting surface of the small aperture.

If the light-emitting element is further provided with a transparent protective film that is coated onto an inner wall of the small aperture, it is possible to prevent the diameter of the small aperture from expanding unexpectedly if there is a sudden increase in current while the laser is being used in practice.

If the light-emitting element is further provided with a second wavefront converter for focussing light that is emitted from the light-emitting portion and supplying the same to the first wavefront converter, it is possible to further improve the evanescent output.

In this case, it is preferable that the second wavefront converter is any one of a concave reflective mirror, a Fresnel lens, a waveguide layer having a non-uniform spatial distribution of refractive indices, a planar reflective mirror, or a convex lens, for focusing light emitted from the light-emitting portion onto the small aperture.

In addition, the first wavefront converter could have a non-uniform spatial distribution of refractive indices, with the radiating range of light emitted from the light-emitting portion being output as output light after being converted into a radiating range that is smaller than the wavelength thereof, by a lens effect created by the spatial distribution of refractive indices.

In this case, the spatial distribution of refractive indices is created by varying effective refractive indices in a spatial manner, in accordance with a plasma effect achieved by varying the injection density of carriers in a spatial manner by adjusting values of resistivity within the first waveform converter.

This invention also relates to a surface-emitting type of light-emitting element comprising a multi-layered structure comprising a light-emitting layer; and a pair of electrodes for supplying a current to the light-emitting layer; wherein output light is output from a light-emitting surface of the multi-layered structure; and the pair of electrodes are provided in a recessed position from the light-emitting surface toward the light-emitting layer side. This makes it possible to bring the light-emitting surface extremely close to an object to be illuminated.

If the light-emitting surface is a surface of a wavefront converter having a small aperture of a diameter that is smaller than the wavelength of light emitted from the light-emitting layer; and the output light comprises an evanescent wave that is output to the exterior through this small aperture, it is possible to shine an evanescent wave reliably onto an object to be illuminated, by positioning the output surface of the evanescent wave sufficiently close to the target, such as an optical disc.

In this case, both of the pair of electrodes are provided on the same side, on either a top surface side or a rear surface side of the multi-layered structure.

The configuration could be such that one of the pair of electrodes and the light-emitting surface is provided on a main-surface side of the multi-layered structure and the other of the pair of electrodes is provided on a rear-surface side of the multi-layered structure, or the configuration could be such that the light-emitting surface is provided on the main-surface side of the multi-layered structure and both of the electrodes are provided on the rear-surface side of the multi-layered structure.

When the pair of electrodes are connected electrically to wires, if each of the electrodes is provided in such a manner as to not protrude on the side from which emitted light is extracted, it is possible to bring the light-emitting element sufficiently close to an object to be illuminated, to illuminate the object reliably with an evanescent wave.

It is also possible to improve the efficiency with which light is extracted, by further providing a transparent dielectric layer that is disposed on a light-emitting surface of the small aperture.

It is further possible to prevent the small aperture from expanding unexpectedly if there is a sudden increase in current while the laser is being used in practice, by providing a transparent protective film that is coated onto an inner wall of the small aperture.

If the light-emitting element is further provided with a second wavefront converter for focusing light that is emitted from the light-emitting layer and supplying the same to the small aperture, it is possible to improve the light output even further.

In this case, the second wavefront converter is preferably any one of a concave reflective mirror, a Fresnel lens, a waveguide layer having a non-uniform spatial distribution of refractive indices, a planar reflective mirror, or a convex lens, for focusing light emitted from the light-emitting portion onto the small aperture.

A method of fabricating a light-emitting element in accordance with the present invention, wherein the light-emitting element has a multi-layered structure comprising a light-emitting portion made of a nitride semiconductor, and a thin film in which is formed a small aperture having a diameter that is smaller than the wavelength of light emitted from the light-emitting portion; such that at least part of the light emitted from the light-emitting portion is produced as an evanescent wave through the small aperture, comprises the steps of: forming the multi-layered structure; forming the thin film on a surface of the multi-layered structure; and opening up the small aperture in the thin film in a self-aligning manner, by supplying a current to the light-emitting portion and illuminating light that is emitted from the light-emitting portion onto the thin film. This makes it possible to open up the small aperture, in an extremely easy and reliable manner, and also makes it unnecessary to use expensive equipment such as an FIB.

In this case, if the diameter of the small aperture is adjusted in the step of opening up the small aperture, by monitoring light that is projected through the small aperture with a detector, it is possible to control the diameter of the aperture easily and reliably.

Furthermore, if the diameter of the small aperture is adjusted in the step of opening up the small aperture, by monitoring light that is projected through the small aperture with a detector, it is unnecessary to place the detector too close to the light-emitting element.

This fabrication method could further comprise a step of coating an inner wall of the small aperture with a material that is transparent with respect to light that is emitted from the light-emitting portion, after the step of opening up the small aperture. This makes it possible to prevent the aperture from expanding unexpectedly if there is a sudden increase in current while the laser is being used in practice.

The effects achieved by the above described configurations are discussed below.

First of all, the present invention makes it possible to implement suitable beam characteristics, by providing a light-emitting element, which is made of a nitride semiconductor, and a wavefront converter.

In other words, it is possible to focus light from the light-emitting portion without using any form of optical system such as a lens, by producing an evanescent wave through the small aperture. As a result, the spot size of the thus obtained evanescent wave can be made no more than one-tenth the size of that in a conventional DVD system. This means that it is possible to implement an ultra-high-density optical disc system or a magneto-optical disc system that has a recording capacity that is at least one hundred times that of a conventional DVD system.

It is also unnecessary to adjust the lens to cope with changes in the wavelength, or adjust the optical axis within the pickup.

As described above, the present invention has many advantages from the industrial point of view in that it provides an ultra-high-density optical disc system that is inexpensive and highly reliable, by implementing a light-emitting element that has an extremely small spot size.

BRIEF DESCRIPTION OF THE DRAWINGS

The present invention will be understood more fully from the detailed description given herebelow and from the accompanying drawings of preferred embodiments of the invention. However, the drawings are not intended to imply any limitation of the invention to a specific embodiment, but are for explanation and understanding only.

In these drawings:

FIG. 1 shows schematic views of a light-emitting element in accordance with an embodiment of this invention, where FIG. 1A is a plan view of the light-emitting element and FIG. 1B is a section taken along the line A–A';

FIG. 2 is a graph showing how the light absorption coefficient of silicon depends upon wavelength;

FIGS. 3A to 3D are schematic views of a method of forming a small aperture in accordance with this invention;

FIG. 4A is a schematic view of essential components of a light-emitting element in accordance with a second embodiment of the invention;

FIG. 4B is a schematic view of a first variation of this second embodiment;

FIG. 5A is a schematic view of a second variation of this second embodiment;

FIG. 5B a schematic view of a third variation of this second embodiment;

FIGS. 11A to 11C are plan views illustrating states in which guided light is refracted by a wavefront converter 722;

FIG. 13 is a schematic section through the structure of a light-emitting element in accordance with a ninth embodiment; and FIG. 14 is a schematic section through a variation of the ninth embodiment of this invention.

DETAILED DESCRIPTION OF PREFERRED EMBODIMENTS

Figure 3C:
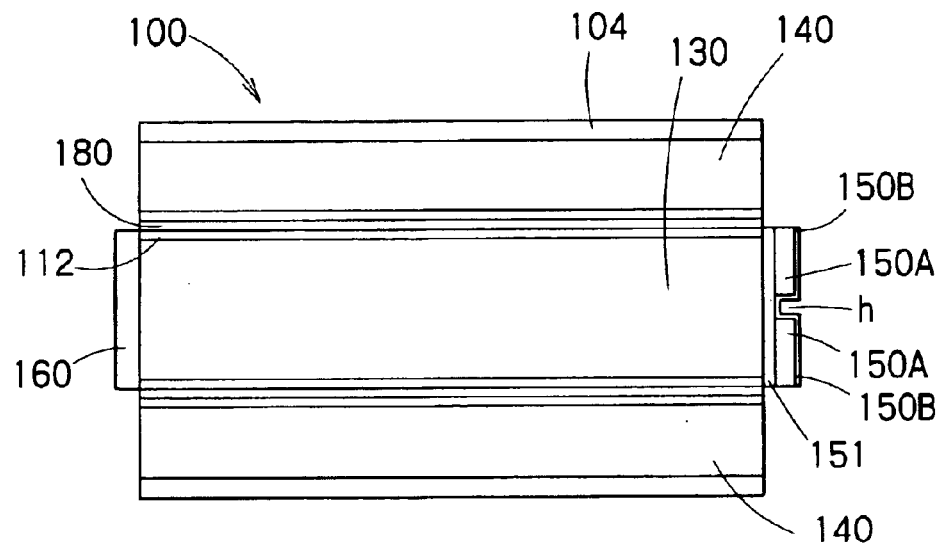

This invention makes it possible to produce an evanescent wave by using a wavefront converter of a simple structure, and also makes it possible to utilize spot-sized beam of light that is far smaller than that of the prior art. As a result, it is possible to implement an ultra-high-density optical disc system that is 100 times as high as a DVD system of the prior art.

Embodiments of the present invention are described below with reference to the accompanying drawings.

A schematic view of a light-emitting element in accordance with an embodiment of this invention is shown in FIG. 1. FIG. 1A is a plan view thereof and FIG. 1B is a section taken along the line A-A' in FIG. 1A. A light-emitting element 100 shown in these figures is made of nitride semiconductors and is a semiconductor laser that is known as an edge-emitting semiconductor laser. A wavefront converter 150 is provided on one facet thereof, in such a manner that evanescent waves can be extracted from a small aperture h thereof.

The shape of the small aperture h could be circular, or it could equally well be any shape other than circular. In this document, "small aperture" is defined as an aperture wherein the minimum distance of spacings between edges facing the aperture is approximately the same as the wavelength of light emitted by the light-emitting element, or even smaller. If the small aperture h is a pin-hole, by way of example, the diameter thereof is approximately the same as the wavelength of the light emitted thereby, or even smaller.

In FIG. 1A, the longitudinal direction indicated by the double-headed arrow is the direction of the resonator of the laser. Reference number 150 denotes the wavefront converter that is the main focus of this invention. In this specific example, this wavefront converter 150 is formed of silicon (Si) and the small aperture h is opened in a portion thereof on which the laser light is projected, to dimensions that are approximately the same as the wavelength of the laser light, or even smaller. In addition, reference number 151 in FIG. 1A denotes a dielectric film that acts as a spacer between the wavefront converter and the laser facet. In this specific example, the thickness thereof is determined by a silicon oxide ($SiO_2$) film of a thickness that is approximately the same as the wavelength of the laser, or even smaller. A highly reflective film 160 that has a high coefficient of optical reflectivity is provided on the other facet of the element.

The element of this configuration makes it possible to utilize an evanescent wave. In other words, if the diameter of the small aperture h that is provided in the wavefront converter 150 is approximately the same as the wavelength of light emitted from the laser, or even smaller, a propagated wave of the laser light is not projected outside through the small aperture h, and only an evanescent wave that diminishes dramatically with distance from the wavefront converter 150 is projected. The size of the field of this evanescent wave is approximately the same as the diameter of the small aperture h. That is to say, it is possible to obtain an extremely small spot-sized beam of light that is approximately the same size as the diameter of the small aperture h.

Use of this evanescent wave makes it possible to focus light to a size that is substantially the same as the diameter of the small aperture h, without using a lens. Thus, if the small aperture h is disposed in the close vicinity of an optical disc (not shown in the figures), it is possible to either detect or form tiny pits (indentations formed in the disc surface) that are smaller than the wavelength of the laser light, making it possible to implement an ultra-high-density optical disc system.

More specifically, in a method that uses an optical system implemented by a conventional lens, the diameter D of the beam spot of focused light is given by: D=λ/NA, where λ is the wavelength of the light and NA is the numerical aperture of the lens. Taking the rating for a prior-art digital versatile disc (DVD) system by way of example, the wavelength of the light is 650 nm and the standard numerical aperture of the lens is approximately 0.6. It is therefore clear that the diameter D of the beam spot of focused light is approximately 1 μm.

In contrast thereto, the present invention makes it possible to obtain an evanescent wave of a size that is substantially the same as that of the diameter of the small aperture h. If, for example, the diameter of the small aperture h is made to be 100 nm, the beam spot of the evanescent wave is roughly 100 nm or less.

The minimum size of pits formed on an optical disc is proportional to the diameter of the beam spot of light. In other words, the recording capacity of an optical disc is inversely proportional to the square of the diameter of the beam spot of light. Thus the present invention makes it possible to increase the recording capacity of an optical disc to at least one hundred times that of a conventional DVD system, even if the diameter of the small aperture h is 100 nm. Moreover, since there is no need for an external optical system comprising components such as a lens, it is possible to implement an optical pickup that does not require fine positioning with respect to the optical axis, has a lower construction cost, and is highly reliable. In this case, the light-emitting element in accordance with this invention is disposed in the vicinity of an optical disc and means such as a piezoelectric element could be used as an actuator, to implement the reading and writing of data by an evanescent wave.

The description now turns to a specific example of the configuration of the semiconductor laser of this embodiment, with reference to FIG. 1B. The semiconductor laser is provided with a sapphire substrate 101, wherein the c surface is the main surface, and a multi-layer stack of nitride semiconductors formed thereon. One example of such multi-layer stack is, starting from the substrate side: a 50-nm GaN buffer layer 102; a high-temperature GaN buffer layer 103 (undoped, 0.5 μm thick, with a carrier density of $1 \times 10^{17}$ cm$^{-1}$); an n-type GaN contact layer 104 (silicon-doped, 0.4 μm thick, with a carrier density of $2 \times 10^{18}$ cm$^{-3}$); an n-type AlGaN cladding layer 105 (8% aluminum composition, silicon-doped, 0.5 μm thick, with a carrier density of $1 \times 10^{18}$ cm$^{-3}$); an n-type GaN guide layer 106 (silicon-doped, 0.3 μm thick, with a carrier density of $1 \times 10^{17}$ cm$^{-3}$); an active layer 107 of an InGaN/InGaN multiple quantum well (MQW) configuration (five pairs, with the well layers having an 18% indium composition and a thickness of 4 nm, and the barrier layers having an 8% indium composition and a thickness of 2 nm); a p-type GaN guide layer 108 (magnesium-doped, 0.3 μm thick, with a carrier density of $1 \times 10^{17}$ cm$^{-3}$); and a p-type AlGaN cladding layer 109 (8% aluminum composition, magnesium-doped, 0.5 μm thick, with a carrier density of $2 \times 10^{17}$ cm$^{-3}$).

In addition, an n-type InGaN current-blocking layer 110 (silicon-doped, 15% indium composition, 0.2 μm thick, with a carrier density of $1 \times 10^{18}$ cm$^{-1}$) having a stripe-shaped hole of a width of 5 μm is formed on top of the p-type AlGaN cladding layer 109, and on top of that are formed a p-type GaN contact layer 111 (magnesium-doped, 0.3 μm thick, with a carrier density of $1 \times 10^{17}$ cm$^{-3}$) and a highly doped p-type GaN contact layer 112 (magnesium-doped, 0.1 μm thick, with a carrier density of $5 \times 10^{17}$ cm$^{-3}$).

Electrodes for supplying a current to the above laser structure could be electrodes 140 of multiple layers of titanium (Ti) and gold (Au), for the n-type contact layer 104, and an electrode 130 of multiple layers of platinum (Pt), titanium (Ti), platinum (Pt), and gold (Au), in sequence from the semiconductor side, for the p-type contact layer 112.

The method of fabricating this laser element will now be briefly described. The multi-layered structure of nitride semiconductors could be formed by a method such as metal-organic chemical vapor deposition (MOCVD) or molecular beam epitaxy (MBE) Examples of source materials that can be used with MOCVD include trimethyl gallium, trimethyl aluminum, trimethyl indium, and ammonia.

The method of exposing part of the n-type contact layer 104 for the formation of the n-side electrodes 140 could be a method of formation by etching after the entire multi-layered structure has been grown, or by selective growth after the n-type contact layer 104 has been formed.

After facets have been formed on the thus-constructed laser element by a method such as cleavage, the highly reflective film 160 is formed on the rearward facet and the dielectric film 151 and wavefront converter 150 are formed on the forward facet. A so-called DBR (distributed Bragg reflector) mirror, made up of a stack of a plurality of thin dielectric films, could be used as the highly reflective film 160, by way of example. A dielectric film of silicon oxide or silicon nitride could be used as the spacer 151, by way of example. The role of the spacer 151 is, first of all, to maintain the optical reflectivity that is necessary for the laser surface. Thus a DBR mirror made up of a stack of dielectric layers could also be used as the spacer 151. The spacer 151 also has the role of improving the adhesive strength of the wavefront converter 150. It is therefore preferable to use a material that provides good adhesive strength between the facet of the laser element and the wavefront converter 150. The spacer 151 has a further role of providing electrical insulation between the wavefront converter 150 and the facet of the laser element. In other words, the side surfaces of the n-type semiconductor layers and the p-type semiconductor layers are exposed on the facet of the laser element, as should be clear from FIG. 1B, so that if a dielectric material is used as the material of the wavefront converter 150, it is necessary to cover the facet with an insulator to ensure that the p-n junctions are not snort-circuited. From this viewpoint, it is preferable that the spacer 151 is constructed of a material that is insulating. Other than silicon oxide or silicon nitride, it is preferable that a dielectric film of a material such as titanium oxide ($TiO_2$) or aluminum oxide ($Al_2O_3$) is used as the material of the spacer 151.

Another characteristic of the present invention is the use of silicon as the material of the wavefront converter 150.

A graph of how the light absorption coefficient of silicon varies with wavelength is shown in FIG. 2. As shown in this figure, silicon is transparent to long wavelengths but its absorption coefficient of light is extremely large in the short-wavelength region from blue onward. The absorption coefficient has a large value of $2 \times 10^5$ cm$^{-1}$ for light of wavelength 400 nm, for example. In other words, there is an extremely large absorption coefficient in the wavelength region of a nitride semiconductor laser element. Thus if the film thickness thereof is on the order of 200 nm, the laser light is substantially blocked and it is therefore possible to cause an evanescent wave to be generated from the small aperture alone.

In this case, the intensity of the evanescent wave decreases exponentially from the edge portion on the inlet side of the aperture portion of the small aperture, and is dependent only on the range of the diameter of the small aperture. If the diameter of the small aperture h is 0.1 μm, for example, the dependent range of the evanescent wave does not exceed approximately 0.1 μm. It is therefore important to ensure that the wavefront converter 150 is sufficiently thin enough to ensure that evanescent wave is produced outward at a high intensity. If silicon is used, as in this embodiment, it is possible to make the wavefront converter 150 thin enough at approximately 200 nm, so that the evanescent wave is produced outward at a large intensity. In addition to silicon, further examples of the material of the film that configures the wavefront converter 150 which could be cited include a semiconductor with a narrow energy gap such as geranium (Ge) or indium nitride (InN), a conductor such as carbon (C), or a metal such as indium (In), gold (Au), aluminum (Al), platinum (Pt), or silver (Ag). If one of these metal materials is used, the film could be made even thinner.

These materials could be deposited to a predetermined thickness onto the facet of the laser element by various different methods such as vapor deposition, sputtering, or CVD.

One method of forming the small aperture h in the wavefront converter 150 is to rapidly irradiate a laser beam of an output higher than that of the laser element under ordinary usage conditions, to form the small aperture.

Steps in a method of forming the small aperture in a self-aligning manner in accordance with this invention are shown in FIGS. 3A to 3D. In other words, FIGS. 3A to 3D illustrate the method of opening the small aperture h in the laser shown in FIG. 1A, where portions that are the same as those in FIG. 1A are given the same reference numbers and further description thereof is omitted.

First of all, a thin film 150A of silicon or the like is coated over the facet of the laser, as shown in FIG. 3A. This thin film 150A will become the wavefront converter 150. A light detector 2000 is disposed facing this facet. As will be described later in more detail, this light detector 2000 need only detect a propagating wave from the laser, not an evanescent wave emitted therefrom. It is therefore not necessary to make the distance from the thin film 150A to the light detector 2000 extremely short; this distance could be several millimeters to several centimeters. In this state, a current is injected through the laser to generate a laser beam.

As the output of the laser beam increases until it reaches a certain output level, the thin film 150A is opened out in a self-aligning manner by the laser beam, as shown in FIG. 3B. Ordinarily, a laser beam projected from the facet of a laser has a spatial intensity distribution that approximates to a Gaussian distribution. The size of the small aperture that is opened in the thin film 150A can therefore be adjusted by controlling the output level and projection time of the laser beam as appropriate.

Once the aperture has been formed, the propagating light components of the laser are detected by the light detector 2000. If the relationships between the operating conditions of the laser, the aperture diameter, and the detection output of the light detector 2000 have been investigated beforehand, therefore, it is possible to verify that a predetermined aperture has been created by monitoring the detection output of the light detector 2000.

When the predetermined aperture has been created, the surface of the thin film 150A and the inner wall of the aperture are coated with a protective film 150B, as shown in FIG. 3C. This protective film 150B could be formed of various different materials, such as silicon oxide ($SiO_2$) or silicon nitride (SiN). The protective film 1501B has the role of protecting the small aperture h when the laser (light-emitting element) 100 is used subsequently under ordinary operating conditions. It has the role of preventing the diameter of the small aperture h from expanding unexpectedly if there is a sudden increase in current while the laser 100 is being used in practice, by way of example.

It is also possible to employ this protective film 150B as one part of an anti-reflection (AR) film. In other words, it is preferable that an AR coating is formed on the opening portion of the small aperture h in order to increase the efficiency with which the laser light is extracted. In accordance with this invention, the underlying dielectric film 151 and the protective film 150B can be used in their entirety as an AR coating. More specifically, if the wavelength of the laser light is λ, the optical thickness of these layers could be λ/4. To ensure this, it is possible to ensure that the optical thickness of the underlying dielectric film 151 is λ/8 and the optical thickness of the protective film 150B is λ/8.

Figure 3D:
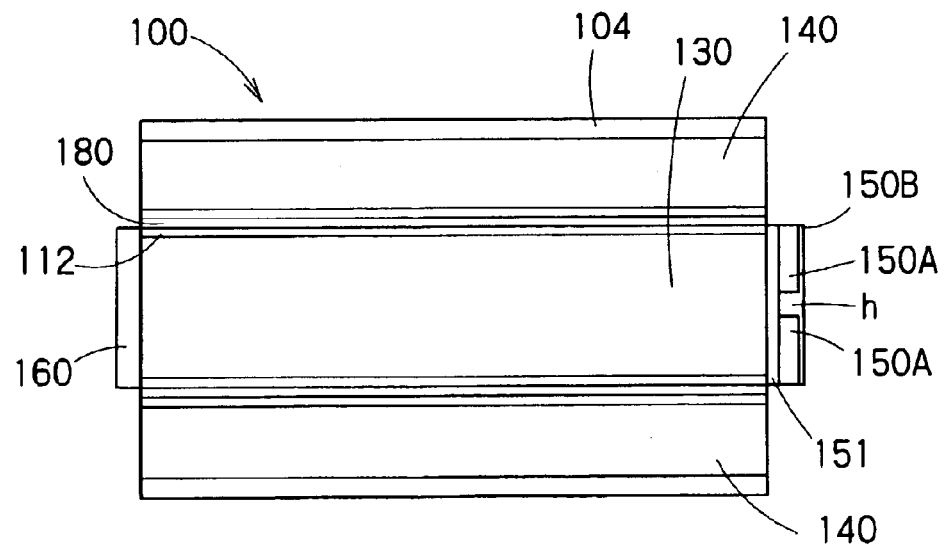

Depending on the method used or the conditions of forming this protective film 150B, the protective film 150B could be formed to fill the small aperture h, as shown in FIG. 3D. In such a case, the function of the wavefront converter 150 is maintained because the protective film 150B is transparent with respect to the wavelength of the laser. In the example shown in FIG. 3D, if the optical thickness of the underlying dielectric film 151 is λ/4 and the optical thickness within the small aperture h of the protective film 150B is λ/2, the total optical thickness is 3λ/4, which enables the combination to function as an AR coating in the same manner as if the thickness is λ/4.

In the method in accordance with this invention, the laser output level that is necessary for forming the aperture can be determined as appropriate by factors such as the material and thickness of the thin film 150A. However this is implemented, the laser output for forming the aperture is greater than the output used during ordinary operating conditions.

If, for example, a film of gold (Au) or silver (Ag) of a thickness of approximately 100 nm is used as the thin film 150A, when laser light has a wavelength of approximately 400 nm, this film will exhibit sufficient light-blocking characteristics under ordinary operating conditions to enable it to function as a wavefront converter. If a gold thin film 150A of approximately this thickness is used, the aperture, that is, the small aperture h, can be formed reliably by setting the laser output to greater than normal.

If silicon (Si) is used as the material of the wavefront converter 150, for laser light that has a wavelength on the order of 400 nm, sufficient light-blocking characteristics can be obtained by ensuring that the thickness of this film is approximately 200 nm, as can be understood from FIG. 2. Even with the silicon thin film 150A, it is possible to open up the small aperture h reliably in a self-aligning manner, provided the laser output is set to be greater than that during ordinary use.

Similarly, if the laser light has a wavelength on the order of 650 nm, as will be described later, use of a gold (Au) film of a thickness of approximately 100 nm as the thin film 150A enables it to act as the wavefront converter and, at the same time, makes it possible to open up the small aperture h in a self-aligning fashion in accordance with this invention.

In the prior art, it has been necessary to employ etching using a focused ion beam (FIB) or the like, in order to open up the small aperture h. However, it is not easy with such methods to align the position of the small aperture h with the optical axis of the laser beam, making it difficult to avoid insufficiencies in the output characteristics due to factors such as positional displacements.

In contrast thereto, the method in accordance with this invention makes it possible to open up a self-aligned small aperture, in an extremely easy and reliable manner, and also makes it unnecessary to use expensive equipment such as an FIB.

The description now turns to a second embodiment of the present invention.

A schematic view of essential components of a light-emitting element in accordance with this second embodiment of the invention is shown in FIG. 4A. This figure shows a section through the essential components, with the front surface being a cross-sectional plane. A light-emitting element 200A shown herein is based on a laser that is known as a vertical-cavity type of surface-emitting laser, with a wavefront converter 225 being provided on the light-emitting surface thereof.

To describe the configuration of this element: a GaN buffer layer 211, a GaN/GaAlN multi-layer film 212, an n-type GaN contact layer 213, an n-type GaAlN cladding layer 214, an n-type GaN waveguide layer 215, an InGaN MQW active layer 216, a p-type GaN waveguide layer 217, a p-type GaAlN cladding layer 218, and an n-type GaAlN current-confining layer 219 are grown in that order on a sapphire substrate 210. The active layer 216 could have an MQW structure comprising a stack of alternating $In_xGa_{1-x}N$ well layers and $In_yGa_{1-y}N$ barrier layers (where $x \geq y$). The crystal growth thereof could be achieved by a method such as MOCVD or MBE.

The n-type GaAlN current-confining layer 219 is partially etched away so that it has a circular aperture portion, then a p-type GaN contact layer 220 and a GaN/GaAlN multi-layer film 221 are formed thereon. The crystal growth thereof could be achieved by a method such as MOCVD or MBE.

This multi-layered structure is machined to remove two sides and leave a mesa shape, as shown in the figures. Parts of each of the substrate 210 and the n-type GaN contact layer 213 are exposed on either side of the mesa. An $SiO_2$ film 222 is formed over the side surfaces of this mesa portion. A p-side electrode 223 is formed on top of the exposed portion of the substrate 210 and the $SiO_2$ film 222, and an n-side electrode 224 is formed on top of the exposed portion of the n-type GaN contact layer 213.

The wavefront converter 225 of a material such as silicon (Si) is then formed on top of the GaN/GaAlN multi-layer film 221. A small aperture h of a diameter of approximately 100 nm is formed in the center of this wavefront converter 225.

In the light-emitting element 200A shown in the figures, each of the GaN/GaAlN multi-layer film 212 and the GaN/GaAlN multi-layer film 221 acts as a resonator mirror, forming a vertical resonator, so that the light-emitting element has the configuration of a laser that is known as a vertical-cavity surface-emitting laser.

The wavefront converter 225 provided on the facet of the resonator has the function of converting light from within the resonator into an evanescent wave. In other words, the diameter of the small aperture h is approximately 100 nm, in contrast to the wavelength of light emitted from the active layer 216 which is on the order of approximately 400 to 500 nm, so it is less than the lasing wavelength of the laser element. For that reason, the laser beam is not projected to the exterior of the small aperture h as propagating light; it becomes an evanescent wave that diminishes rapidly with distance from the small aperture h. It is therefore possible to obtain a spot-sized light beam that is approximately the same size as the diameter of the small aperture h, as previously described with reference to the first embodiment of this invention.

In this embodiment too, it is possible to make the thickness of the wavefront converter 225 suitably thin by using silicon therefor, as previously described with reference to FIG. 2, so that an evanescent wave of a high intensity can be obtained from the small aperture h.

In this embodiment too, it is possible to open up the small aperture h in a self-aligning manner, by increasing the laser output to greater than that under ordinary conditions, as previously described with reference to FIG. 3.

In addition, the light-emitting surface of the surface-emitting laser in accordance with this embodiment of the invention is provided with stepped surfaces to form a mesa, and the p-side electrode 223 is formed to extend as far as a base surface B of the corresponding step. The p-side electrode 223 and the n-side electrode 224 are each connected to wires W on the respective step surfaces. Moving the wire-bonding positions away from the light-emitting surface of the element in this manner ensures that the wires W do not interfere with a target such as an optical disc (not shown in the figure) and thus the wavefront converter 225 can be disposed sufficiently close thereto. Since this invention makes use of an evanescent wave that exists only within an extremely limited field, it is particularly important to have a configuration that makes it possible to position the wavefront converter 225 sufficiently close to the target.

A perspective view of a section through the components of a first variation of the light-emitting element in accordance with this embodiment is shown in FIG. 4B. Portions in this figure that are the same as those described previously with reference to FIG. 4A are given the same reference numbers and further description thereof is omitted. In a light-emitting element 200B shown in FIG. 4B, each of the GaN/GaAlN multi-layer film 212 and the GaN/GaAlN multi-layer film 221 acts as a resonator mirror, forming a vertical resonator, so that the light-emitting element has the configuration of a laser that is known as a vertical-cavity surface-emitting laser. It should be noted, however, that a structure known as a λ-cavity is formed of the layers 214 to 218 between the multi-layer films 212 and 221. In other words, it is possible to have a configuration that is extremely effective in generating resonance of light in the vertical direction, by making the overall optical thickness of the layers 214 to 218 substantially the same as the wavelength λ of the laser beam.

In addition, the current-confining layer 219 in the light-emitting element 200B is formed within the multi-layer film 221. This current-confining layer 219 can be formed by selectively implanting protons into the multi-layer film 221. If the multi-layer film 221 comprises a layer of a material containing aluminum, such as AlGaN or AlN, the current-confining layer 219 could also be formed by selectively oxidizing this layer containing aluminum.

An optical thin film 270 of a dielectric material such as SiO or SiN is formed between the multi-layer film 221 and the wavefront converter 225. If the optical thickness of this thin film 270 is such that it is λ/4 with respect to the wavelength λ of the laser (an AR coating), it is possible to improve the efficiency at which laser light is produced from the small aperture h and, at the same time, improve the reflective efficiency of laser light on the lower side of the wavefront converter 225. Note that it is preferable to make this thin film 270 integral with the protective film that forms part of the wavefront converter 225, and adjust the optical thickness thereof to be λ/4, as previously described with reference to FIG. 3C.

A perspective view of a section through the components of a second variation of the light-emitting element in accordance with this embodiment is shown in FIG. 5A. A light-emitting element 200C shown in this figure is also based on a vertical-cavity surface-emitting laser. The basic components thereof can be assumed to be identical to those illustrated in FIGS. 4A and 4B, so portions having the same functions are given the same reference numbers and further description thereof is omitted. This variation differs from the light-emitting elements shown in FIGS. 4A and 4B in that electrodes are provided on upper and lower surfaces of the light-emitting element, by removing the sapphire substrate 210 after the crystalline growth steps.

In order to implement this configuration, it is necessary to provide a GaN layer 250 of a thickness of approximately 80 µm between the multi-layer film 212 and the buffer layer 211 grown on a substrate 210. The buffer layer 211 and the substrate 210 are not shown in FIG. 5A. Since the layer 250 acts as a contact layer from the rear surface, it is preferably n-type with a carrier density of $10^{18}$/cm$^3$. To remove the substrate 210, it is necessary to employ some means such as using a material for the buffer layer 211 that can easily be etched, such as InN, or utilizing an SiO$_2$ film that is formed locally. In addition, the multi-layer film 212 need not be formed during the crystal growth steps; instead, the n-side electrode could be made transparent and a reflective film could be formed on the outer side-of this electrode 224.

In this variation of the embodiment too, it is possible to open up the small aperture h in a self-aligning manner, by increasing the laser output to greater than that under ordinary conditions, as previously described with reference to FIG. 3.

A perspective view of a section through the components of a third variation of the light-emitting element in accordance with this embodiment is shown in FIG. 5B. A light-emitting element 200D shown in this figure is also based on a vertical-cavity surface-emitting laser. The basic components thereof can be assumed to be identical to those illustrated in FIGS. 4A to 5A, so portions having the same functions are given the same reference numbers and further description thereof is omitted. This variation is structurally similar to that shown in FIG. 5A, in that the electrodes are provided on surfaces above and below the light-emitting element, by using a conductive GaAs substrate as the substrate 250.

It should be noted, however, that the multi-layered structure and the materials of the element are different. In other words, the light-emitting element 200D is configured of an n-type GaAs substrate 250, an n-type GaAs buffer layer 211, an n-type Ga$_{0.5}$Al$_{0.5}$As/AlAs multi-layer film 212, an n-type InGaAlP cladding layer 214, an InGaAlP waveguide layer 215, an MQW active layer 216 of InGaP/InGaAlP, an InGaAlP waveguide layer 217, a p-type InGaAlP cladding layer 218, a p-type Ga$_{0.5}$Al$_{0.5}$As/AlAs multi-layer film 221, and a current-confining layer 219.

The current-confining layer 219 can be formed by selective oxidation of the multi-layer film 221 or by selective implantation of protons thereinto.

In this variation of the embodiment too, the layers from the cladding layer 214 to the cladding layer 218 configure a λ-cavity, in the same manner as that described previously with reference to FIG. 4B, and the multi-layer films 212 and 221 are provided above and below as reflective mirrors.

The laser of this variation makes it possible to obtain a high-output evanescent wave in the vicinity of a wavelength of 650 nm, by adjusting the composition and structure of the active layer 216 as appropriate. In order to accommodate laser light in the vicinity of this wavelength of 650 nm, it is preferable to use gold (Au) or silver (Ag), which have high absorption coefficients in that wavelength band, as the material of the wavefront converter 225.

In this variation of the embodiment too, it is possible to open up the small aperture h in a self-aligning manner, by increasing the laser output to greater than that under ordinary conditions, as previously described with reference to FIG. 3.

If the materials of the various layers in the structure of the light-emitting element 200D are modified, it is possible to obtain an evanescent wave in the vicinity of a wavelength of 850 nm. In other words, if n-type Ga$_{0.5}$Al$_{0.5}$As/AlAs is used for the multi-layer film 212, n-type GaAlAs is used for the cladding layer 214, a MQW structure of GaAs/GaAlAs is used for the active layer 216, p-type AlGaAs is used for the cladding layer 218, and p-type Ga$_{0.5}$Al$_{0.5}$As/AlAs is used for the multi-layer film 221, it is possible to obtain an evanescent wave in the vicinity of a wavelength of 850 nm. In this case too, the configuration could be such that the cladding layers 214 to 218 form a λ-cavity.

Similarly, in this case too, the current-confining layer 219 can be formed by selective oxidation of the multi-layer film 221 or by selective implantation of protons thereinto.

The description now turns to a third embodiment of the present invention.

Figure 6:
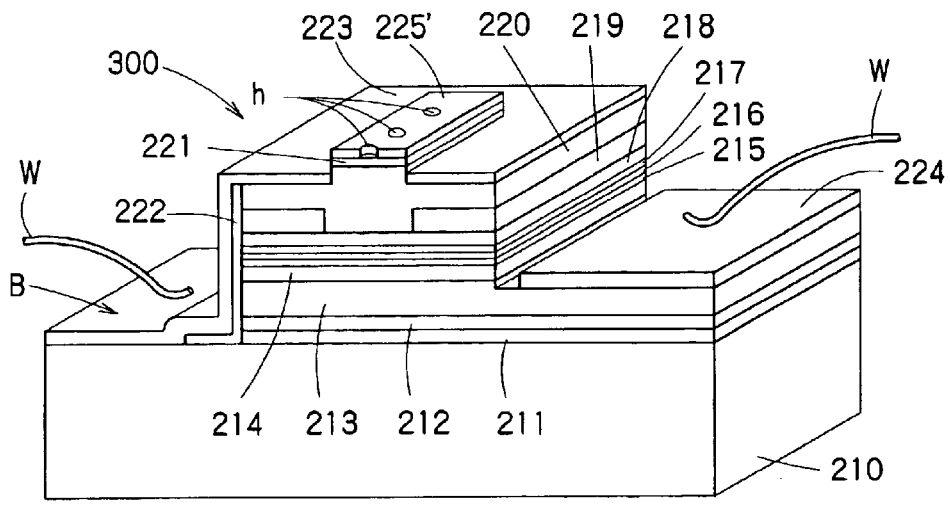
FIG. 6 is a perspective view of a section through the structure of a light-emitting element in accordance with this third embodiment.

A perspective view of a section through the structure of a light-emitting element in accordance with this third embodiment is shown in FIG. 6. A light-emitting element 300 shown in this figure is also based on a vertical-cavity surface-emitting laser. The basic components thereof can be assumed to be identical to those of the light-emitting elements 200A to 200D that were described previously with reference to the second embodiment, so portions having the same functions are given the same reference numbers and further description thereof is omitted. This embodiment is characterized in that a plurality of resonators and small apertures are formed therein, to create an array. If this light-emitting element 300 is used as a pickup head, it is possible to simultaneously-record or reproduce a plurality of tracks of an optical disk (not shown in the figure).

Note that this embodiment is illustrated as having a one-dimensional array of resonators and small apertures h, but it should be obvious to those skilled in the art that this invention is not limited thereto and thus a two-dimensional array is also possible within the scope of this invention. The structure of the surface-emitting laser shown in this figure, in particular, is convenient in that it makes it possible to implement a two-dimensional array in a simple manner.

The description now turns to a fourth embodiment of the present invention.

Figure 7:
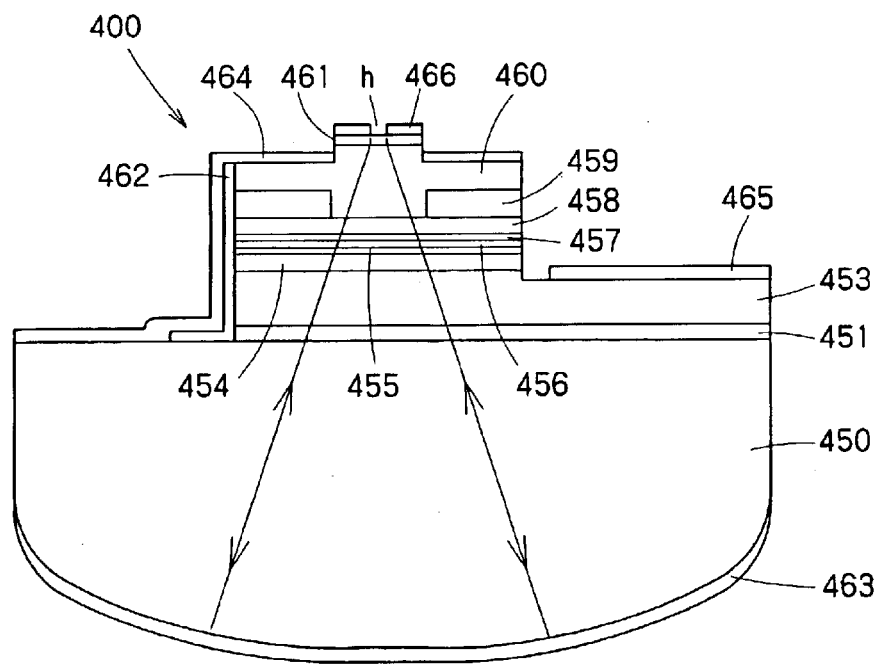
FIG. 7 is a schematic section through the structure of a light-emitting element in accordance with a fourth embodiment of the invention.

A schematic section through the structure of a light-emitting element 400 in accordance with this fourth embodiment of the invention is shown in FIG. 7. The light-emitting element 400 of this figure is also based on a vertical-cavity surface-emitting laser. Reference number 450 denotes a sapphire substrate, and a GaN buffer layer 451, an n-type GaN contact layer 453, an n-type GaAlN cladding layer 454, an n-type GaN waveguide layer 455, an InGaN MQW active layer 456, a p-type GaN waveguide layer 457, a p-type GaAlN cladding layer 458, an n-type GaAlN current-confining layer 459, and a p-type GaN contact layer 460 are grown on top of this substrate 450. In addition, reference number 461 denotes an SiO$_2$/TiO$_2$ multi-layer film, reference number 462 denotes an SiO$_2$ film, reference number 463 denotes another SiO$_2$/TiO$_2$ multi-layer film, reference number 464 denotes a p-side electrode, reference number 465 denotes an n-side electrode, and reference number 466 denotes a silicon film provided with a small aperture h.

This embodiment of the invention is characterized in having the SiO$_2$/TiO$_2$ multi-layer film 463 that acts as a second wavefront converter, in addition to the silicon film 466 that acts as the first wavefront converter. This second wavefront converter is obtained by subjecting the rear surface side of the sapphire substrate to curved-surface machining then forming the multi-layer film 463 on this surface. Since light is returned to the multi-layer film mirror of the small aperture by this curved-surface mirror, a stable, highly efficient resonator is formed thereby.

The description now turns to a fifth embodiment of the present invention.

Figure 8A:
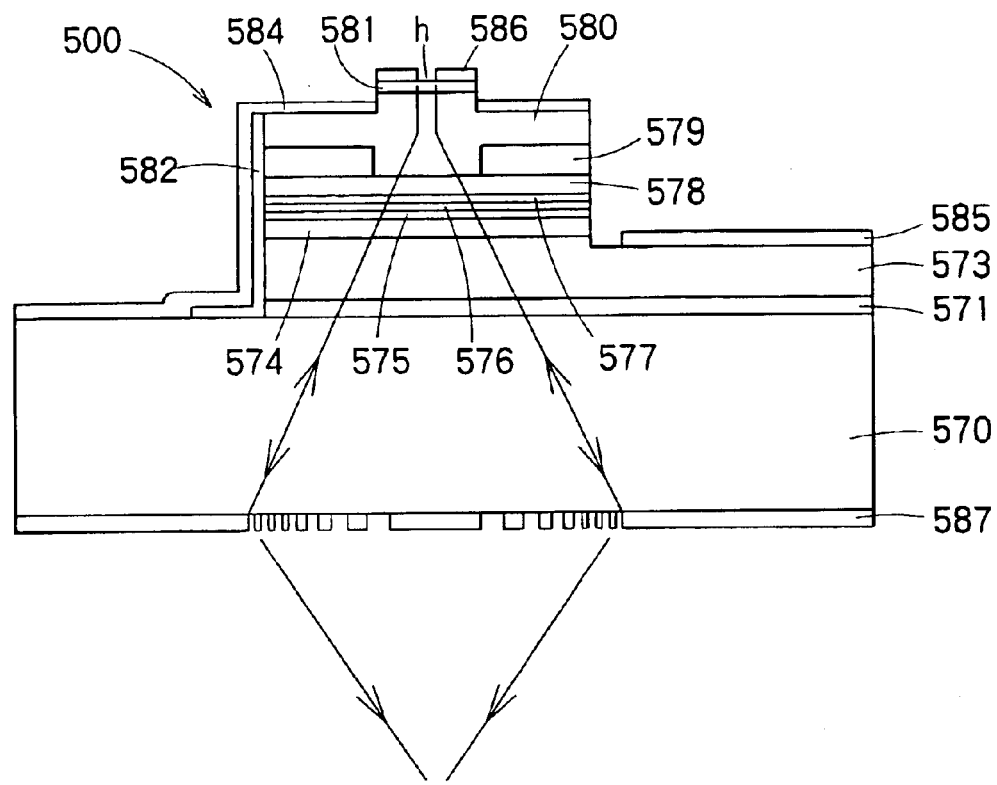
FIG. 8 shows schematic views of the structure of a light-emitting element in accordance with a fifth embodiment of the invention, with FIG. 8A being a section therethrough and FIG. 8B showing a base view thereof.
Figure 8B:
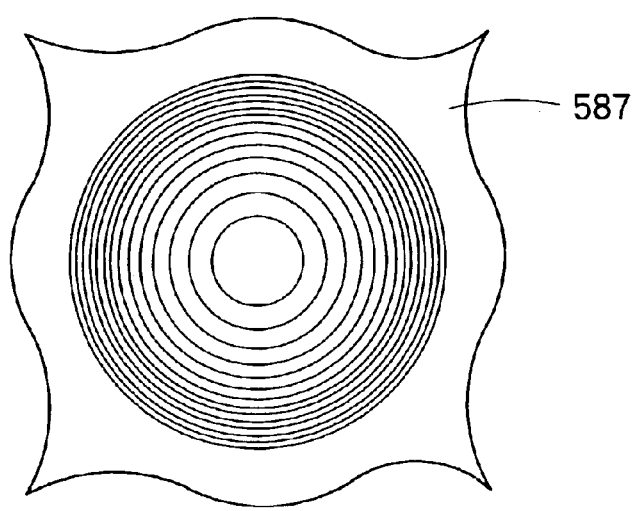

Schematic views of the structure of the light-emitting element in accordance with this fifth embodiment of the invention are shown in FIG. 8, with FIG. 8A being a section therethrough and FIG. 8B showing a base view of an essential component thereof. A light-emitting element 500 of these figures is also based on a vertical-cavity surface-emitting laser. Reference number 570 denotes a sapphire substrate, and a GaN buffer layer 571, an n-type GaN contact layer 573, an n-type GaAlN cladding layer 574, an n-type GaN waveguide layer 575, an InGaN MQW active layer 576, a p-type GaN waveguide layer 577, a p-type GaAlN cladding layer 578, an n-type GaAlN current-confining layer 579, and a p-type GaN contact layer 580 are grown on top of this substrate 570. In addition, reference number 581 denotes an SiO$_2$/TiO$_2$ multi-layer film, reference number 582 denotes an SiO$_2$ film, reference number 584 denotes a p-side electrode, reference number 585 denotes an n-side electrode, and reference number 586 denotes a silicon film provided with a small aperture which acts as a first wavefront converter. Reference number 587 denotes a diffraction grating lens that acts as a second wavefront converter. The diffraction grating lens 587 is a Fresnel lens which uses a material such as SiO$_2$ and which has a planar pattern as shown in FIG. 8B.

In this embodiment of the invention, the SiO$_2$/TiO$_2$ multi-layer film 581 and the diffraction grating lens 587 together configure a resonator. Since the light reflected back by the diffraction grating lens 587 is returned to the multi-layer film 581 of the small aperture h, a stable, highly efficient resonator is formed thereby.

Projected light that has passed through the diffraction grating lens 587 can also be focused on the lower side of the substrate 570. In other words, it is possible to produce an evanescent wave through the small aperture h of the silicon film 586 and, at the same time, it is possible to produce light that has been focused by the diffraction grating lens, from the rear-surface side of the substrate. This light on the rear-surface side can be used, for example, as a monitoring light for controlling the laser output or as a probe light for detecting the location of a pickup of an optical disc system.

If only the light from the rear-surface side is to be used, the small aperture h on the front-surface side is not necessary and thus it is not absolutely necessary to form the silicon film 586. If light from the rear-surface side is not to be used, on the other hand, the reflectivity of the diffraction grating lens 587 could be increased to make a highly reflective type of diffraction grating lens.

The description now turns to a sixth embodiment of the present invention.

Figure 9A:
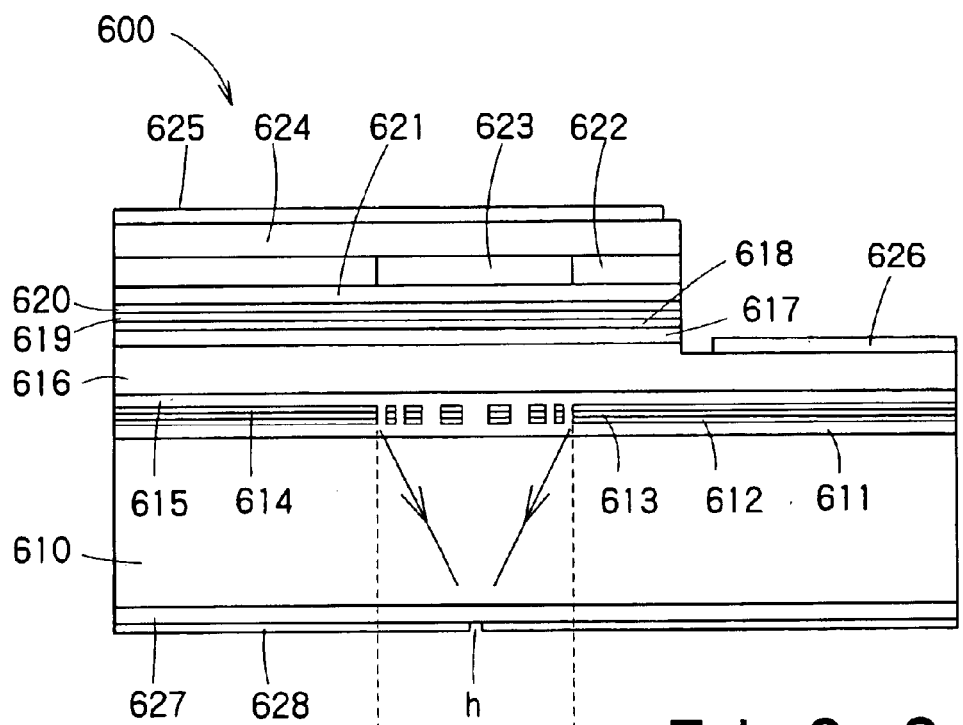
FIG. 9 shows schematic views of the structure of a light-emitting element in accordance with a sixth embodiment of the invention, with FIG. 9A being a section therethrough and FIG. 9B showing the planar pattern thereof.
Figure 9B:
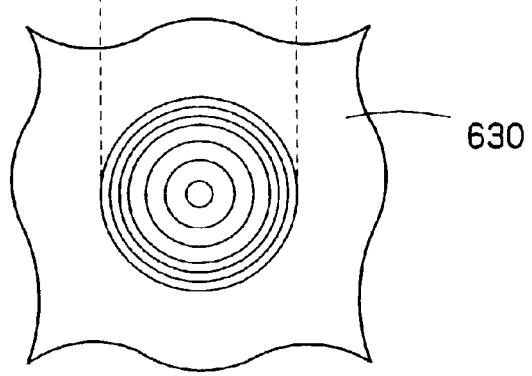

Schematic views of the structure of the light-emitting element in accordance with this sixth embodiment of the invention are shown in FIG. 9, with FIG. 9A being a section therethrough and FIG. 9B showing the planar pattern of an essential component thereof. A light-emitting element 600 of these figures is also based on a vertical-cavity surface-emitting laser. Reference number 610 denotes a sapphire substrate, a first GaN buffer layer 611 is deposited upon this substrate 610, then an SiO$_2$ layer 612, a metal film 613, and another SiO$_2$ layer 614 are further deposited thereon. These SiO$_2$ layers and the metal film 612 to 614 are partially removed by etching to form a diffraction grating lens 630 of the pattern shown in FIG. 9B. A second GaN buffer layer 615 is grown on top of this structure. During the growth of this second GaN buffer layer 615, epitaxial growth is generated from the lower first GaN buffer layer 611 on the lower level, through the opening of the diffraction grating lens 630, and also lateral growth proceeds within the plane of the surface, to obtain the second GaN buffer layer 615 in a monocrystalline form.

An n-type GaN contact layer 616, an n-type GaAlN cladding layer 617, an n-type GaN waveguide layer 618, an InGaN MQW active layer 619, a p-type GaN waveguide layer 620, a p-type GaAlN cladding layer 621, an n-type GaAlN current-confining layer 622, a p-type GaN layer 623, and a p-type GaN/p-type GaAlN multi-layer film 624 are then grown, in that order, on top of the above structure. Reference number 625 denotes a p-side electrode, reference number 626 denotes an n-type electrode, reference number 627 denotes an SiO$_2$/TiO$_2$ multi-layer film, and 628 denotes a silicon film provided with a small aperture h.

In this embodiment of the invention, the silicon film 628 acts as a first wavefront converter and the diffraction grating lens 630 on top of the sapphire substrate acts as a second wavefront converter. The laser light can be focused onto the rear surface of the sapphire substrate by the diffraction grating lens 630. In addition, a very intense evanescent wave can be produced through the small aperture h of the silicon film 628 that is the first wavefront converter.

Since the refractive index of the sapphire substrate 610 is greater than 1 in this case, it is possible to make the numerical aperture (NA) of the diffraction grating lens 630 also greater than 1. In such a case, the field of light on the lower side of the substrate 610 is evanescent and a spot that is smaller than the wavelength can be obtained, even if the first wavefront converter, that is, the silicon film 628 provided with the small aperture, is omitted. It should be obvious that it is possible to add the small aperture, as described with respect to this embodiment, to obtain an evanescent wave of an extremely small spot size.

The description now turns to a seventh embodiment of the present invention.

Figure 10A:
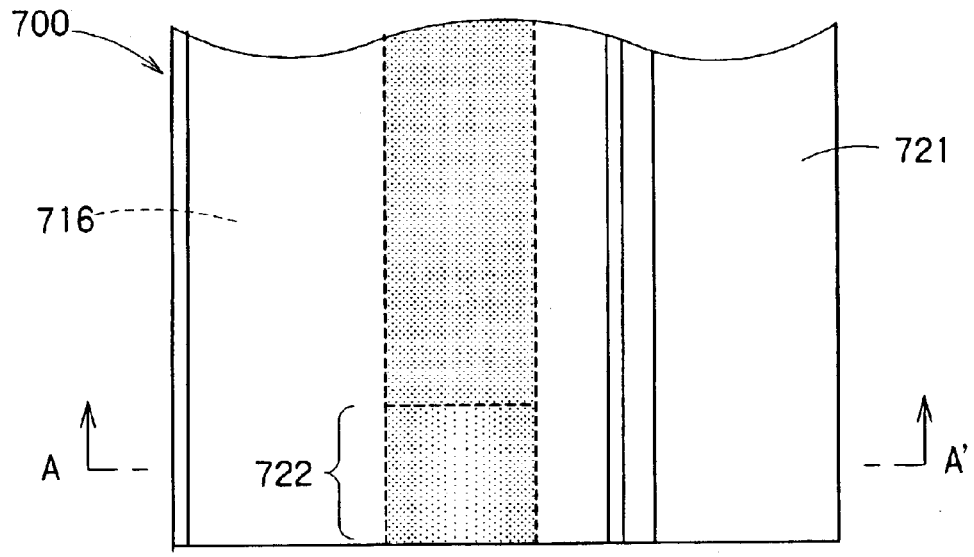
FIG. 10 shows schematic views of the structure of a light-emitting element in accordance with a seventh embodiment of the invention, with FIG. 10A being a transparent plan view thereof, FIG. 10B being a section taken along the line A-A', and FIG. 10C being a graph of the distribution of resistivity and refractive index along the line A-A' of the end portion of the waveguide layer.
Figure 10B:
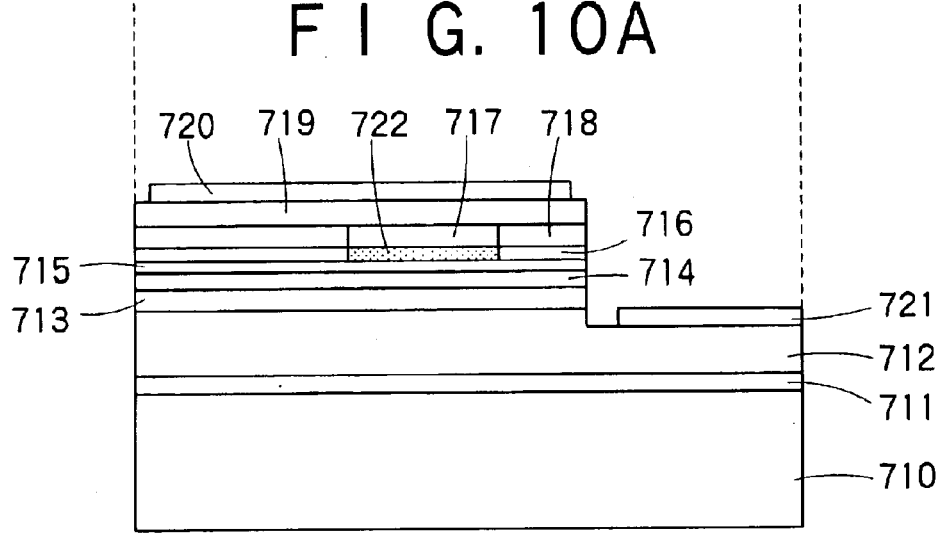
Figure 10C:
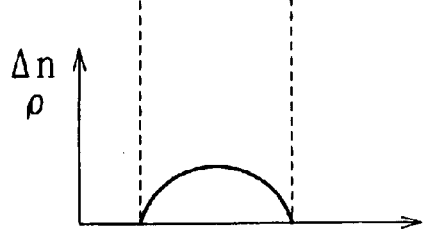

Schematic views of the structure of the light-emitting element in accordance with this seventh embodiment of the invention are shown in FIG. 10, with FIG. 10A being a transparent plan view of essential components thereof, FIG. 10B being a section taken along the line A-A', and FIG. 10C being a graph of the distribution of resistivity and refractive index along the line A-A' of the end portion of the waveguide layer.

A light-emitting element 700 of these figures is based on an edge-emitting laser. The description first concerns the structure of the section shown in FIG. 10B, where reference number 710 denotes a sapphire substrate. On top of this substrate 710 are formed a GaN buffer layer 711, an n-type GaN contact layer 712, an n-type GaAlN cladding layer 713, an n-type GaN contact layer 712, an n-type GaAlN cladding layer 713, an n-type GaN waveguide layer 714, an InGaN multi-layer MQW active layer 715, a p-type GaN waveguide layer 716, a p-type GaAlN cladding layer 717, an n-type GaAlN current-confining layer 718, and a p-type GaN contact layer 719. Reference number 720 denotes a p-side electrode and reference number 721 denotes an n-side electrode.

In this embodiment of the invention, a wavefront converter 722 is provided in the vicinity of a projection facet on one side of the laser element. The wavefront converter 722 is configured from a local modification of the resistivity of the p-type GaN waveguide layer 716, in a portion in the vicinity of the facet. In other words, the configuration is such that the resistivity in the center of this stripe is high whereas that at the outer sides thereof is low, as shown in FIG. 10C. Since the implantation of carriers into the active layer of portions outside the stripe is greater than that at the center of the stripe, this effectively lowers the refractive index on the outer sides of the stripe, due to the plasma effect, as shown in FIG. 10C. The wavefront converter therefore acts as a lens with respect to the guided light.

Plan views that illustrate the states in which guided light is refracted by the wavefront converter 722 are shown in FIG. 11. In other words, the distribution of light within the wavefront converter 722 can be divided into a number of manifestations, depending on the refractive index thereof and the length L of the wavefront converter 722.

In the example shown in FIG. 11A, the length L of the wavefront converter is greater than the focal length of the guided light. As a result, the guided light comes to a focus outside the facet, as shown in this figure. In the example shown in FIG. 11B, the focal length of the guided light matches the length L of the wavefront converter. As a result, the guided light comes to a focus at the facet. In the example shown in FIG. 11C, the length L of the wavefront converter is twice the focal length of the guided light. As a result, the light is projected parallel from the facet-of the laser, as shown in this figure.

In this manner, this embodiment of the invention makes it possible to control the distribution of intensity of the projected light, by adjusting the refractive index distribution and the length L of the wavefront converter 722, to provide a desirable projected wavefront, even over a comparatively wide stripe.

The wavefront converter 722 can be fabricated by shining an electron beam thereon, by way of example. In other words, after the p-type GaN waveguide layer 716 has been formed, acceptors within the stripe portion are activated by irradiating an electron beam thereon. During this time, the distribution of this electron beam illumination is adjusted so that the dosage of electrons is larger in the outer portions of the stripe but lower in the central portion thereof. This makes it possible to implement a structure having a low resistance on the outer sides and a high resistance in the center.

Note that since this method forms a stripe-shaped portion by electron beam illumination, the n-type GaAlN current-confining layer 718 is not absolutely necessary. In other words, if there is no electron beam illumination on the outer sides of the stripe, no current will flow therethrough because the resistance there is higher, and thus the stripe itself can implement current constriction.

Another method of forming the wavefront converter 722 is ion implantation. In other words, a p-type GaN waveguide layer 716 having a distribution of resistivities similar to that of FIG. 10C can be formed by implanting a p-type impurity such as magnesium (Mg) into the p-type GaN waveguide layer 716 at a certain dosage distribution, then annealing the element if necessary.

Alternatively, a p-type GaN waveguide layer 716 having a distribution of resistivities similar to that of FIG. 10C can be fabricated by doping a p-type impurity uniformly during the crystal growth of the p-type GaN waveguide layer 716, then implanting ions of hydrogen (H) at a certain dosage distribution. This makes use of a phenomenon such that the p-type impurity, such as magnesium, that is doped during the crystal growth is activated by the hydrogen ion implantation.

Yet another method could be one in which both a p-type impurity such as magnesium and an n-type impurity such as silicon are doped into the p-type GaN waveguide layer 716, where the density distribution of either one or both of these impurities is controlled. That is to say, a p-type GaN waveguide layer 716 having a distribution of resistivities similar to that of FIG. 10C can be fabricated by varying the amount of doped n-type impurity with respect to that of the p-type impurity to control the compensation of acceptors.

In this example, the resistivity of the p-type GaN waveguide layer 716 is modified, but it should be obvious to those skilled in the art that the resistivity of the active layer 715 could also be modified. Furthermore, the resistivity of the p-type GaAlN cladding layer 717 could also be modified in a similar manner, or the resistivities of both the waveguide layer 716 and the cladding layer 717 could be modified.

The description now turns to an eighth embodiment of the present invention.

Figure 12A:
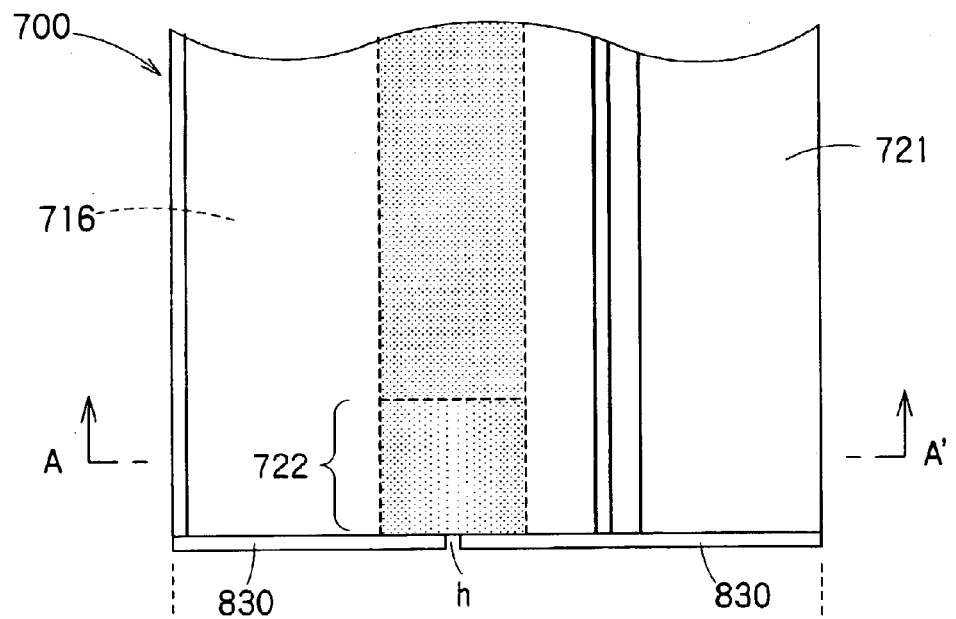
FIG. 12 shows schematic views of the structure of a light-emitting element in accordance with an eighth embodiment of the invention, with FIG. 12A being a transparent plan view thereof, FIG. 12B being a section taken along the line A-A', and FIG. 12C being a graph of the distribution of resistivity and refractive index along the line A-A' of the end portion of the waveguide layer.
Figure 12B:
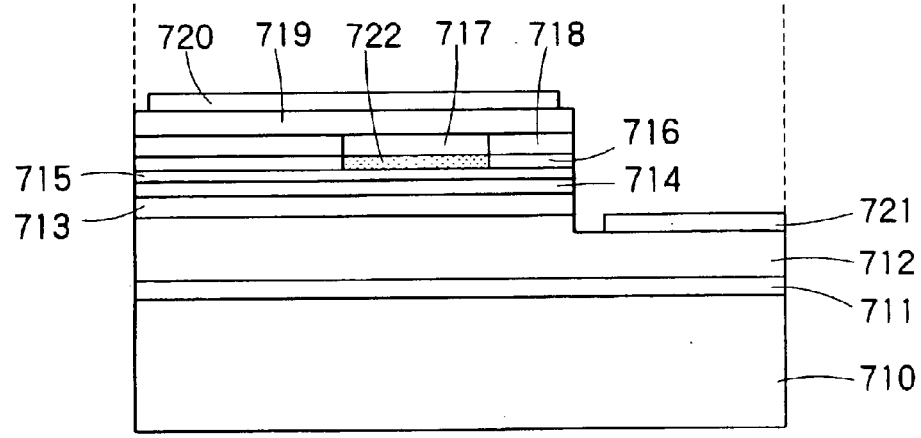
Figure 12C:
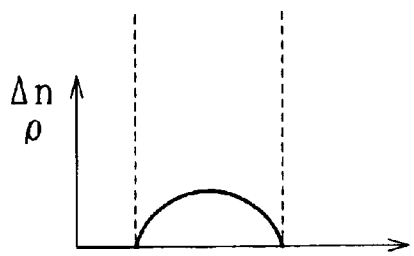

Schematic views of the structure of the light-emitting element in accordance with this eighth embodiment of the invention are shown in FIG. 12, with FIG. 12A being a transparent plan view of essential components thereof, FIG. 12B being a section taken along the line A-A', and FIG. 12C being a graph of the distribution of resistivity against refractive index along the line A-A' of the end portion of the waveguide layer. A light-emitting element 700 shown in these figures is provided with a wavefront converter 830 having a small aperture h, on the facet on the light-emitting side of the light-emitting element 700 shown in FIG. 10.

In this case, details of the light-emitting element 800 such as the facet structure thereof are the same as those described previously with reference to FIG. 10, so further description thereof is omitted.

In this embodiment of the invention, the guided light is focused by the wavefront converter 722 and can be extracted to the exterior as an evanescent wave through the small aperture h of the wavefront converter 830. To increase the intensity of the evanescent wave that is focused from the guided light in the small aperture h, it is preferable that the refractive index distribution and the length L of the wavefront converter 722 are set in such a manner that the guided light is focused at the facet, as shown in FIG. 11B.

This embodiment of the invention is advantageous in that it makes it possible to produce an evanescent wave of an extremely high intensity, by further focusing the guided light in an edge-emitting laser.

The description now turns to a ninth embodiment of the present invention.

A schematic section through the structure of a light-emitting element in accordance with this ninth embodiment is shown in FIG. 13. This section is taken laterally in the direction of the resonator formed by a light-emitting layer.

Other layers such as guide layers, cladding layers, and contact layers that may be formed between a substrate 1101 and a light-emitting layer 1116 or between a light-emitting layer 1116 and an electrode 1120 omitted from this figure. This embodiment of the invention is advantageous in that the output intensity can be further increased, because a region in which the gain is high can be formed over a longer distance. The light generated in the light-emitting layer 1116 resonates between a highly reflective film 1130 and a wavefront converter 1128 via a highly reflective film 1131, then can be extracted to the exterior by a small aperture h formed within the wavefront converter 1128. In this case, it is preferable that a dielectric film having a multi-layered structure is formed as the highly reflective film 1131 on top of a semiconductor surface that is inclined at an angle of 45 degrees to the major plane of the substrate 1101.

A variation of this embodiment of the invention is shown in FIG. 14. In this figure too, other layers such as guide layers, cladding layers, and contact layers that may be formed above and below a light-emitting layer are omitted. This embodiment differs from the light-emitting element shown in FIG. 12 in having a configuration in which an absorbent layer 1228 having a small aperture h is formed on top of a lens 1229 that is machined from a substrate 1101. This variation of the invention makes it possible to increase the intensity of the evanescent wave that is emitted through the small aperture h, by providing the lens 1229.

The present invention has been described above with reference to specific examples thereof. However, the present invention is not limited to these specific examples.

For example, the structural configurations of the edge-emitting lasers and surface-emitting lasers described above are nothing more than examples and thus other types of current injection structures, current-confining structures, and combinations of materials can be used to similar effect.

In addition, the material used for the substrate is not limited to sapphire, and thus various effects can be achieved by using insulating substrates of materials such as spinel, MgO, ScAlMgO$_4$, LaSrGaO$_4$, or (LaSr)(AlTa)O$_3$, or conductive substrates of materials such as SiC, Si, or GaN in a similar manner.

In addition to the previously described edge-emitting lasers and surface-emitting lasers, the effects of the invention can be obtained by using edge-emitting light-emitting diodes (LEDs) or surface-emitting LEDs in a similar manner.

Furthermore, the shape and size of the small aperture are not limited to those described above, and similar effects can be obtained by setting as appropriate the relationship of those dimensions with respect to the wavelength of the light emitted from the light-emitting portion.

While the present invention has been disclosed in terms of preferred embodiments, in order to facilitate better understanding thereof, it should be appreciated that the invention can be embodied in various ways without departing from the principle of the invention. Therefore, the invention should be understood to include all possible embodiments and modifications to the shown embodiments which can be implemented without departing from the principle of the invention as set forth in the appended claims.

What is claimed is:

1. A light-emitting element of surface-emitting type, comprising:
   a substrate having a first surface and a second surface, said substrate being transparent to light with a wavelength of λ;
   first conductive type semiconductor layer formed on said first surface of said substrate;
   a light-emitting layer formed on said first conductive type semiconductor layer and emitting light with a wavelength of λ by current injection;
   a second conductive type semiconductor layer formed on said light-emitting layer and having an electrode forming surface and a projecting portion, said projecting portion projecting from said electrode forming surface in a thickness direction to guide light from said light-emitting layer to outside;
   a wavefront converter of a material opaque to said light from said light-emitting layer, formed on said projecting portion of said second conductive type semiconductor layer, being separate from said electrode forming surface in the thickness direction, and having a small aperture with a diameter smaller than the wavelength λ of the light;
   a first electrode formed on a surface of said first conductive type semiconductor layer on the side of said light-emitting layer so as to be electrically connected to said first conductive type semiconductor layer;
   a second electrode formed on said electrode forming surface of said second conductive type semiconductor layer, the surface thereof being recessed from said wavefront converter toward said light-emitting layer side; and
   a diffraction grating lens formed on said second surface of said substrate to have a planar pattern, and reflecting part of said light emitted from said light-emitting layer toward said substrate as a reflection light, the reflection light being focused toward the small aperture of said wavefront converter, the reflection light and light emitted from said light-emitting layer toward said second conductive type semiconductor layer being narrowed at the small aperture and emitted as an output light, the output light including evanescent waves.

2. The light-emitting element as defined in claim 1, wherein:
   said diffraction grating lens allows a remaining portion of the light emitted from said light-emitting layer toward said substrate to pass therethrough as a transmission light, the transmission light being focused on a side opposite to said substrate relative to said diffraction grating lens; and
   the transmission light being emitted as a light on a rear-surface side.

3. The light-emitting element as defined in claim 2, wherein said light on the rear-surface side can be used as a monitoring light for controlling a light output of said output light or as a probe light for detecting the location of said light-emitting element.

4. The light-emitting element as defined in claim 1, wherein said diffraction grating lens is a Fresnel lens.

5. The light-emitting element as defined in claim 1, wherein said light emitting layer comprises a nitride semiconductor layer containing In.

6. The light-emitting element as defined in claim 5, wherein said substrate is a sapphire substrate.

7. The light-emitting element as defined in claim 1, wherein said diffraction grating lens contains SiO$_2$.

8. The light-emitting element as defined in claim 1, wherein said light-emitting element is a vertical-cavity surface-emitting laser.

9. The light-emitting element as defined in claim 8, further comprising a multi-layer film formed between the surface of said projecting portion of said second conductive type semiconductor layer and said wavefront converter, wherein at least said multi-layer film and said diffraction grating lens constitute a resonator.

10. A vertical-cavity surface-emitting laser comprising:
   a substrate having a first surface and a second surface, said substrate being transparent to light with a wavelength of $\lambda$;
   a first conductive type semiconductor layer formed on said first surface of said substrate;
   a light-emitting layer formed on said first conductive type semiconductor layer and emitting light with a wavelength of $\lambda$ by current injection;
   a second conductive type semiconductor layer formed on said light-emitting layer and having an electrode forming surface and a projecting portion, said projecting portion projecting from said electrode forming surface in a thickness direction to guide the light from said light-emitting layer to outside;
   a multi-layered film formed on said projecting portion of said second conductive type semiconductor layer and being separate from said electrode forming surface in the thickness direction,
   a wavefront converter of a material opaque to said light from said light-emitting layer, formed on said multi-layered film, and having a small aperture with a diameter smaller than the wavelength $\lambda$ of the light;
   a first electrode formed on a surface of said first conductive type semiconductor layer on the side of said light-emitting layer so as to be electrically connected to said first conductive type semiconductor layer;
   a second electrode formed on said electrode forming surface of said second conductive type semiconductor layer, the surface thereof being recessed from said wavefront converter toward said light-emitting layer side; and
   a diffraction grating lens formed on said second surface of said substrate to have a planar pattern, at least said diffraction grating lens and multi-layered film constitute a resonator, said diffraction grating lens reflecting part of light emitted from said light-emitting layer toward said substrate as a reflection light, the reflection light being focused toward the small aperture of said wavefront converter, the reflection light and light emitted from said light-emitting layer toward said second conductive type semiconductor layer being narrowed at the small aperture and emitted as an output light, the output light including evanescent waves.

11. The vertical-cavity surface-emitting laser as defined in claim 10, wherein:
   said diffraction grating lens allows a remaining portion of the light emitted from said light-emitting layer toward said substrate to pass therethrough as a transmission light, the transmission light being focused on a side opposite to said substrate relative to said diffraction grating lens; and the transmission light being emitted as a light on a rear-surface side.

12. The vertical-cavity surface-emitting laser as defined in claim 11, wherein said light on the rear-surface side can be used as a monitoring light for controlling a light output of said output light or as a probe light for detecting the location of said light-emitting element.

13. The vertical-cavity surface-emitting laser as defined in claim 10, wherein said diffraction grating lens is a Fresnel lens.

14. The vertical-cavity surface-emitting laser as defined in claim 10, wherein said light-emitting layer comprises a nitride semiconductor layer containing In.

15. The vertical-cavity surface-emitting laser as defined in claim 10, wherein said substrate is a sapphire substrate.

16. The vertical-cavity surface-emitting laser as defined in claim 10, wherein said diffraction grating lens contains $SiO_2$.

17. A light-emitting element of surface-emitting type, comprising:
   a substrate having a first surface and a second surface, said substrate being transparent to light with a wavelength of $\lambda$;
   a first conductive type semiconductor layer formed on said first surface of said substrate;
   a light-emitting layer formed on said first conductive type semiconductor layer and emitting light with a wavelength of $\lambda$ by current injection;
   a second conductive type semiconductor layer formed on said light-emitting layer and having an electrode forming surface and a projecting portion, said projecting portion projecting from said electrode forming surface in a thickness direction to guide the light from said light-emitting layer to outside;
   a wavefront converter of a material opaque to said light from said light-emitting layer, formed on said projecting portion of said second conductive type semiconductor layer and being separate from said electrode forming surface in the thickness direction, and having a small aperture with a diameter smaller than the wavelength $\lambda$ of the light;
   a first electrode formed an a surface of said first conductive type semiconductor layer on the side of said light-emitting layer, and electrically connected to said first conductive type semiconductor layer, a first electrode lead member being connected to a surface of said first electrode;
   a second electrode having an upper stage electrode layer, a lower stage electrode layer, and a connection layer connecting the upper stage electrode layer and the lower stage electrode layer, said lower stage electrode layer being lower than said upper stage electrode layer in the direction of thickness, a second electrode lead member being connected to a surface of said lower stage electrode layer, said upper stage electrode layer being formed on said electrode forming surface of said second conductive type semiconductor layer to be electrically connected to said second conductive type semiconductor layer, and said second electrode being electrically isolated from said first conductive type semiconductor layer; and
   a diffraction grating lens formed on said second surface of said substrate to have a planar pattern, and reflecting part of light emitted from said light-emitting layer toward said substrate as a reflection light, the reflection light being focused toward the small aperture of said wavefront converter, the reflection light and light emitted from said light-emitting layer toward said second conductive type semiconductor layer being narrowed at the small aperture and emitted as an output light, the output light including evanescent waves.

18. The light-emitting element as defined in claim 17, wherein:
   said diffraction grating lens allows a remaining portion of the light emitted from said light-emitting layer toward said substrate to pass therethrough as a transmission light, the transmission light being focused on a side opposite to said substrate relative to said diffraction grating lens; and the transmission light being emitted as a light on a rear-surface side.

19. The light-emitting element as defined in claim 17, further comprising:

a first wire serving as said first electrode lead member, connected to said first electrode, and set back from said wavefront converter toward a side of said substrate; and a second wire serving as said second electrode lead member, connected to said lower stage electrode layer of said second electrode, and set back from said wavefront converter toward the side of said substrate.

20. The light-emitting element as defined in claim 17, wherein said lower stage electrode layer of said second electrode is symmetrical to said first electrode with respect to said projecting portion.

* * * * *